United States Patent [19]

Hughes

[11] Patent Number: 4,958,123
[45] Date of Patent: Sep. 18, 1990

[54] CIRCUIT ARRANGEMENT FOR PROCESSING SAMPLED ANALOGUE ELECTRICAL SIGNALS

[75] Inventor: John B. Hughes, Hove, England

[73] Assignee: U.S. Philips Corporation, New York, N.Y.

[21] Appl. No.: 286,600

[22] Filed: Dec. 16, 1988

[30] Foreign Application Priority Data

Dec. 23, 1987 [GB] United Kingdom ................. 8729987
Jul. 6, 1988 [GB] United Kingdom ................. 8816072

[51] Int. Cl.$^5$ ............................................... G05F 3/24
[52] U.S. Cl. .................................... 323/316; 323/317; 307/296.5; 307/353
[58] Field of Search ............... 323/311, 312, 315, 316, 323/317; 307/352, 353, 296.4, 296.5, 296.6, 296.8

[56] References Cited

U.S. PATENT DOCUMENTS

| | | | |
|---|---|---|---|
| 4,032,839 | 6/1977 | Ahmed | 323/316 |
| 4,513,178 | 4/1985 | Hing et al. | 323/316 |
| 4,560,920 | 12/1985 | Okanobu | 323/316 |
| 4,587,477 | 5/1986 | Hornak et al. | 323/312 |
| 4,675,594 | 6/1987 | Reinke | 323/317 |
| 4,682,098 | 7/1987 | Seevinck et al. | 323/315 |
| 4,897,596 | 1/1990 | Hughes et al. | |

Primary Examiner—Peter S. Wong
Attorney, Agent, or Firm—Bernard Franzblau

[57] ABSTRACT

A circuit arrangement for processing sampled analog electrical signals, each sample being in the form of a current, includes apparatus for combining, in predetermined proportions, the input sample current in a present sample period with current(s) derived from input sample current(s) in one or more preceding sample periods. Apparatus is also provided for deriving the processed output signal from the combined current produced by the combining apparatus in successive sample periods. The circuit arrangement is formed by a plurality of circuit modules, for example, scaling, memory, and integrator modules, each of which may be capable of processing only unidirectional currents. To enable easy interconnection of the modules, each module is arranged to receive and deliver unidirection currents and to generate internally bias currents to enable conversion from bidirectional to unidirectional currents and vice versa.

47 Claims, 20 Drawing Sheets

Fig. 20.
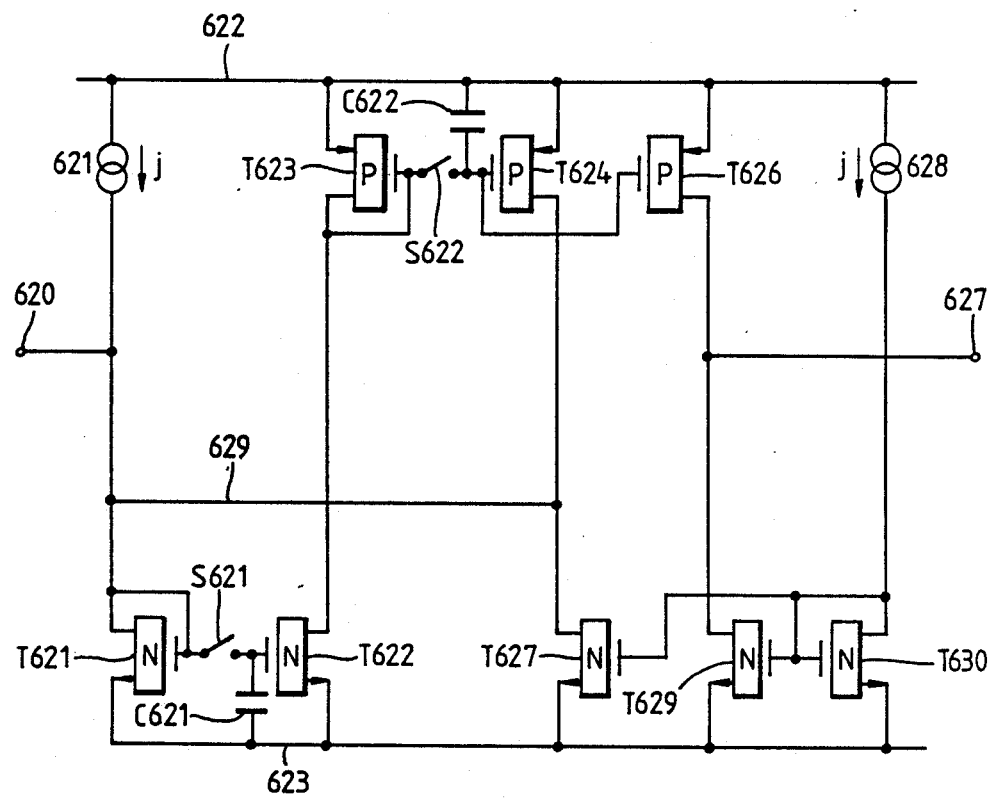
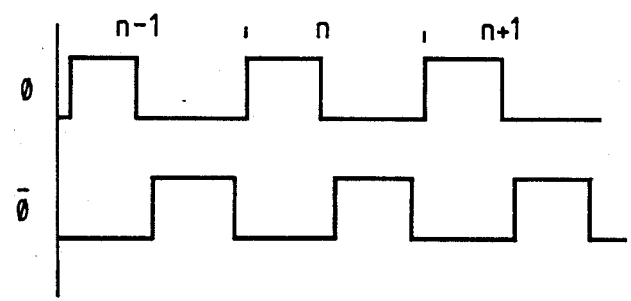
Fig. 21.

$$H(s) = -\frac{1}{sa_0}$$

$$H(z) = -\frac{c}{1-z^{-1}}$$

$$H(z) = -\frac{c}{1-z^{-1}}$$

$$H(s) = -\frac{a_0}{1+sa_1}$$

$$H(z) = -\frac{1}{a-bz^{-1}}$$

$$H(z) = -\frac{1}{a-bz^{-1}}$$

A $$H(s) = \frac{1}{a_0 + a_1 s + a_2 s^2}$$

B $$H(z) = \frac{1}{a + c - (a+b)z^{-1} + bz^{-2}}$$

C $$H(z) = \frac{1}{a + c - (a+b)z^{-1} + bz^{-2}}$$

CIRCUIT ARRANGEMENT FOR PROCESSING SAMPLED ANALOGUE ELECTRICAL SIGNALS

BACKGROUND OF THE INVENTION

This invention relates to a circuit arrangement for processing sampled analog electrical signals.

U.S. Pat. Nos. 4,864,217 (9/5/89) disclose method of processing sampled analog electrical signals in which the electrical quantity manipulated is current. This method is referred to hereinafter as switched current signal processing and circuit arrangements using this method are referred to as switched current circuits. It is known, in switched capacitor circuits, to manipulate electrical charges to perform signal processing of sampled analog electrical signals. However, in order to manipulate the charges high quality linear capacitors are required and in MOS integrated circuits these are commonly fabricated using two polysilicon layers. The provision of two polysilicon layers is not a standard part of the CMOS processes usually used for LSI and VLSI digital circuits and it therefore makes the provision of circuits combining analog and digital signal processing on a single integrated circuit more difficult.

In addition the capacitors required for the signal manipulation in switched capacitor circuits occupy a large area which can be half or more of the total chip area. By using switched current circuits the processing and chip area problems may be mitigated. However, it has been found convenient to use current mirror circuits in the implementation of switched current circuits and, at least in the simpler embodiments, these circuits require a unidirectional input current. Consequently if, as is usually the case, there is a requirement to process bidirectional input signals it is necessary to add a bias current to the bidirectional input current to ensure that a unidirectional input current is available. However, it is then necessary to ensure that the bias current is not itself processed in the same manner as the bidirectional input current since it will then be difficult to separate it from the processed signal current. This requires additional bias current sources at various positions in the processing circuitry having different current magnitudes. Consequently errors can occur due to the difficulty of producing accurately defined bias currents and in particular matching current sources which may be widely separated over the area of an LSI or VLSI chip.

SUMMARY OF THE INVENTION

It is an object of the invention to enable the implementation of a switched current circuit arrangement capable of processing bidirectional input signals in which the problems involved in matching current sources are mitigated.

The invention provides a circuit arrangement for processing sampled analog electrical signals, each sample being in the form of a current, the circuit arrangement comprising means for combining, in predetermined proportions, the input sample current in a present sample period with current(s) derived from input sample current(s) in one or more preceding sample periods, and means for deriving the processed output signal from the combined current produced by the combining means in successive sample periods. The circuit arrangement is formed by a plurality of circuit modules, each circuit module having a current input for receiving a bi-directional input signal current and a current output for supplying a bi-directional output signal current, means for adding a bias current to the bi-directional input current to produce a uni-directinal current for processing by the circuit module and means for subtracting a suitably scaled bias current from the processed uni-directional current to produce bi-directional current at the current output of the circuit module.

By constructing the circuit arrangement from a plurality of circuit modules, which can be designed to perform particular functions, such as current storage, current amplification, current addition or subtraction, current inversion, and transferring only signal currents between the circuit modules, large systems can be constructed without requiring accurately matched bias current sources at widely spaced locations on an integrated circuit substrate. Thus a complex signal processing arrangement can be implemented using comparatively simple building block modules in which each module is capable of receiving and producing bi-directional currents even though within the module only uni-directional currents can be handled.

One of the circuit modules may comprise a current memory module which is capable of reproducing at its output in one sampling period a scaled version of the current applied to its input in a previous sampling period.

In order to process signals in switched current circuits it is necessary to be able to store currents from one sampling period to the next so that sample currents occurring in different sample periods can be combined in a desired manner to perform a given signal processing function.

The current memory module may comprise a current input, a current output, first and second switches controlled by first and second non-overlapping clock signals, and first and second memory cells, wherein the current input is coupled to the first memory cell by means of the first switch and the first memory cell is coupled to the second memory cell by means of the second switch, the output of the second memory cell being coupled to the current output. Each memory cell may comprise a field effect transistor having a capacitor connected between its gate and source electrodes. By storing a charge on a capacitor which causes the gate-source potential of a field effect transistor to be maintained when the driving source is removed, the current produced through the transistor by the driving source can be maintained by the charge on the capacitor. Of course, the effectiveness of the current maintenance depends on the input resistance of the transistor and the period during which the current is to be maintained. Consequently, this is one factor which limits the maximum sampling period.

In each memory cell the field effect transistor may form an output branch of a current mirror circuit. The first and second switches may be arranged to isolate the input and output branches of the current mirror circuits, the output branch of the first current mirror circuit being connected to the input branch of the second current mirror circuit.

Forming the current memory cells as current mirror circuits having their input and output branches isolated by a switch enables the input current to be accurately produced at the output and enables the capacitor to be charged to the correct potential to maintain the output current at the desired value.

At least one of the current mirror circuits may have a non-unity current ratio between its input and output branches. The second current mirror circuit may have a plurality of output branches. This enables the current memory to additionally be given a gain function and/or to be provided with a plurality of independent outputs which may be distributed to various parts of the circuit arrangement as required.

The current memory module may include a first memory cell having an input, an output, means comprising a first switch which is conductive during a first portion of a sample period for connecting the input of the first memory cell to the main current conducting path of a transistor, means comprising a second switch which is conductive during the first portion for connecting the junction of the first switch and the main current conducting path of the transistor to a current maintaining means, and means for connecting the main current conducting path of the transistor to the output of the first memory cell during a second portion of the sampling period, a second memory cell having an input coupled to the output of the first memory cell and an output coupled to the output of the current memory module, and means for coupling the input of the current memory module to the input of the first memory cell.

By using the same transistor for both the input and the output current, errors due to transistor mismatching can be eliminated. However, the output from this alternative memory cell is only available during the second portion of the sampling period.

The means for connecting the main current conducting path of the transistor to the output of the first memory cell may comprise a third switch which is conductive during a second portion of the sampling period which does not overlap the first portion, an output current from the first memory cell being available when the third switch is conductive.

The second memory cell may comprise an input, an output, means comprising a first switch which is conductive during a second portion of a sample period for connecting the input of the second memory cell to the main current conducting path of a transistor, means comprising a second switch which is conductive during the second portion for connecting the junction of the first switch and the main current conducting path of the transistor to a current maintaining means, and means comprising a third switch which is conductive during a first portion of the sampling period which does not overlap the first portion for connecting the main current conducting path of the transistor to the output of the second memory cell, an output current from the current memory being available when the third switch is conductive.

The current memory circuit may comprise means for feeding a bias current to the input of the first memory cell, means for drawing a corresponding bias current from the output of the second memory cell, and a third memory cell, said third memory cell being arranged to store the bias current fed into the input of the first memory cell for subtraction from the output current provided by the second memory cell.

This enables the use of a single bias current source for the addition of the bias current to the input current and the subtraction of the current from the output current and avoids the problem of mismatching between current sources.

The means for subtracting a suitably scaled bias current may comprise a bias current source connected to the input of a current mirror circuit having a number of outputs corresponding to the number of outputs of the current memory module, the output current(s) produced by the current mirror circuit being subtracted from the corresponding output current(s) of the second memory cell.

This enables a single bias current source to be used to subtract bias currents from a plurality of outputs. Any necessary scaling of individual bias currents can be accomplished in the various output branches of the current mirror circuit.

The memory module may have differential inputs and outputs and comprise a plurality of current memory cells, means for coupling each of the differential inputs to a respective current memory cell and means for combining the outputs of selected memory cells for application to the differential current outputs. By performing the signal processing using differential currents, improved performance can be achieved as common mode errors are significantly reduced and power supply noise and even harmonic distortion can be suppressed.

One of the circuit modules may comprise an integrator circuit module which is capable of integrating a bi-directional current applied to its input. The integrator circuit module may comprise a current memory module as set forth above and a feedback loop from a stored current output to a summing arrangement so that a stored current can be added to each current input sample. The integrator may be arranged to integrate differential input currents. The integrator module may be arranged to perform either lossy or lossless integration, for example by appropriately choosing the current ratios of current mirror circuits forming or associated with current memory cells. The integrator modules are useful in forming various filter sections which may be used to construct filters of any desired complexity.

One of the circuit modules may comprise a static module which is capable of producing a scaled version of the current applied to its input at its output. The static module may have a plurality of inputs by means of which a plurality of input currents may be applied to the static module to enable current addition or subtraction to be performed by the static module. The static module may perform a current inversion between its input(s) and output(s).

The static modules allow functions of current gain, signal inversion, current addition, current subtraction, and 'fan-out' to be performed.

The static module may comprise a current scaling circuit, the current scaling circuit comprising means for applying an input current to the input branch of a first current mirror circuit, means for applying a bias current to the input branch of the first current mirror circuit, means for feeding the current from the output branch of the first current mirror circuit to the input branch of a second current mirror circuit, means for feeding the current from the output branch of the second current mirror circuit to the output of the static module, and means for subtracting a bias current so that the output current produced by the scaling circuit is a scaled version of the input current applied to the input of the scaling circuit.

Since the static module has its input connected to the input branch of a current mirror circuit, which input branch is commonly formed by a diode connected transistor, it is necessary to ensure that when that is so the current flows in the current conducting direction of the diode. The provision of a bias current which is added to the input current enables this condition to be achieved for values of input current within the designed range. It would be possible, if a current inversion were desired, to take the output from the output branch of the first current mirror circuit and subtract the bias current, or a multiplied version of the bias current if the first current mirror has a current multiplication factor, from the current in the output branch of the first current mirror circuit to produce the required output current of the static module.

The means for applying a bias current to the input branch of the first current mirror circuit may comprise a first current source and means for adding the current produced by the first current source to the input current and the means for subtracting a bias current may comprise a second current source and a current summing junction to which the output current from the second current source and the output current from the output branch of the second current mirror are applied with appropriate polarity, and means for deriving the scaled output current from the summing junction. The second current mirror circuit may have a plurality of outputs, the static module having a corresponding plurality of outputs, each output of the second current mirror circuit being coupled to a corresponding output of the static module. The means for subtracting the suitably scaled bias current may comprise a bias current source connected to the input of a further current mirror circuit having a number of outputs corresponding to the number of outputs of the second current mirror circuit, the output current(s) produced by the further current mirror circuit being subtracted from the corresponding output current(s) of the second current mirror circuit. The static module may be arranged to produce an inversion of the current applied to its input at its output, the input of the static module being coupled to the input of the further current mirror circuit instead of the input of the first current mirror circuit.

The static module may be arranged to subtract a first current from a second current and have a first input for application of the second current which is coupled to the input of the first current mirror circuit, a second input for application of the first current which is coupled to the input of the further current mirror circuit, and one or more outputs which are coupled to respective output branches of the second current mirror circuit.

The static module may be arranged to process a differential input current and produce a differential output current. The static module may comprise first and second inputs for receiving a differential input current, first and second outputs for producing a differential output current, means for coupling the first input to a first input of a first current summing means, means for coupling a first bias current source to a second input of the first current summing means, means for coupling the output of the first current summing means to the input branch of a first current mirror circuit, means for coupling the second input to a first input of a second current summing means, means for coupling a second bias current source to a second input of the second current summing means, means for coupling the output of the second current summing means to the input branch of a second current mirror circuit, means for coupling a first output branch of the first current mirror circuit to the input branch of a third current mirror circuit, means for coupling a first output branch of the second current mirror circuit to the input branch of a fourth current mirror circuit, means for coupling a second output branch of the first current mirror circuit to a first input of a third current summing means, means for coupling an output branch of the fourth current mirror circuit to a second input of the third current summing means, means for coupling the output of the third current summing means to the first output, means for coupling a second branch of the second current mirror circuit to a first input of a fourth current summing means, means for coupling an output branch of the third current mirror circuit to a second input of the fourth current summing means, and means for coupling the output of the fourth summing means to the second output.

The static module may have a number of further differential outputs wherein each of the current mirror circuits has a corresponding number of further output branches each of which is connected to appropriate further summing nodes.

The static module may have a number of further differential inputs, each further differential input being connected to a further input of the first and second summing nodes.

BRIEF DESCRIPTION OF THE DRAWINGS

Embodiments of the invention will now be described, by way of example, with reference to the accompanying drawings, in which:

FIG. 20 shows an embodiment of an integrator module suitable for use in the arrangement shown in FIG. 1;

FIG. 21 shows clock signals used in the integrator module shown in FIG. 20;

DESCRIPTION OF THE PREFERRED EMBODIMENT

Figure 1:
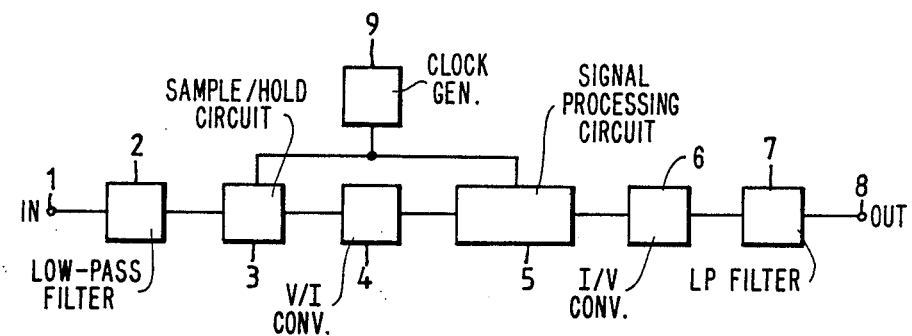
FIG. 1 shows in block schematic form a circuit arrangement for processing sampled analog electrical signals according to the invention.

FIG. 1 shows a circuit arrangement for processing sampled analog electrical signals in which the invention is included. The circuit arrangement shown has an input 1 which is fed to a low pass filter 2 which acts as an anti-alias filter. If the signal is naturally band limited the filter 2 may be omitted. The output of the filter 2 is fed to the input of a sample and hold circuit 3 to produce a sampled input which is fed to a voltage to current converter 4. The output of the voltage to current converter produces a sampled current output which is fed to a signal processing circuit 5. The output of signal processing circuit 5 is fed to a current to voltage converter 6 whose output is passed through a low pass filter 7 to the output 8 of the arrangement. A clock signal is fed from a clock generator 9 to the sample and hold circuit 3 and to the signal processing circuit 5. If the system receives an input signal at input 1 in the form of a current rather than a voltage, the voltage-to-current converter 4 would be omitted. Similarly, if the output signal at output 8 was required to be a current output, then the current to voltage converter 6 would be omitted. The sample and hold circuit 3 could be connected after the voltage-to-current converter if it is implemented as a current memory circuit.

The signal processing circuit 5 is arranged to manipulate sampled currents to produce the desired output signal. The precise form of the signal processing circuit 5 will depend on the signal manipulation to be performed. It may, for example, comprise one or more integrator circuits. The signal manipulation is carried out by combining in desired portions the electrical current in the present sample period with the electrical currents in one or more preceding sample periods. Consequently, the signal processing circuit 5 must be capable of making available the currents from at least the preceding sample period. This does not however, mean that the input current in the preceding sample period has itself to be available but merely that the manipulated current produced during the previous sample period be available together with the current in the present sample period. Typical circuit elements required to perform the manipulation of current samples are current mirror circuits and a current memory. Furthermore, in the majority of applications the state variable is voltage rather than current and hence it is necessary to provide a voltage to current converter and a corresponding current to voltage converter.

In order to perform the signal processing once the signal has been converted to a sampled current, certain basic modules, for example, static modules, memory modules and integrator modules in various combinations dependent on the signal manipulation to be carried out, can be used to form the signal processing arrangements. These modules may be built up from current mirror circuits and for simplicity in describing the static and memory modules a basic current mirror circuit will be shown. However, better performance may be achieved using combinations of alternative current mirrors.

The static modules may have a variety of forms to provide for addition, subtraction, or multiplication of currents or to provide a "fan-out" or plurality of output currents. Similarly, the current memory modules may include a current multiplication and fan-out capability and may include a feedback connection to perform a current addition or subtraction, or an integration function. Additionally the modules may have single ended or differential inputs and outputs.

Each of the modules provided in the signal processing arrangement 5 is arranged to be capable of accepting a bidirectional current input and producing a bidirectional current output. Since the input to a module may be connected to a diode it is necessary to convert the bidirectional input current to a unidirectional input current. This is achieved by adding a bias current, which is generated within the module, to the input current. To obtain a bidirectional output current a further bias current, which is also generated within the module, is subtracted from the output current. By this means only signal currents are passed between the modules and the bias currents in one module are independent of and have no effect on the bias currents in the other modules. Thus matching of bias current generators is only necessary within a module, which will normally be a compact unit occupying only a small portion within an integrated circuit chip and hence the processing conditions are unlikely to vary significantly within a module. Consequently, the problems involved in producing matched bias current generators are reduced.

Figure 2:
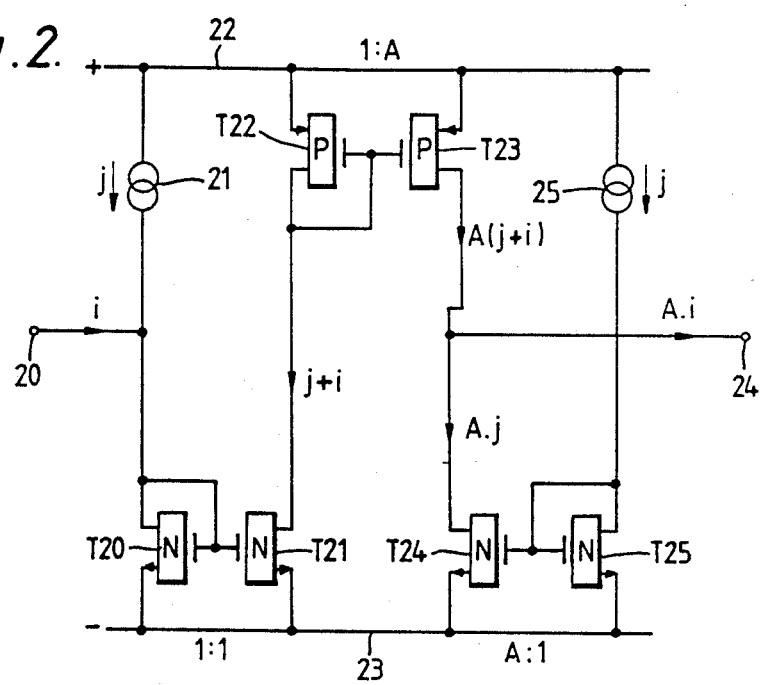
FIG. 2 shows a first embodiment of a static module suitable for use in the arrangement shown in FIG. 1.

FIG. 2 shows a static module which performs the function of a current scaler. This could of course also be termed a current multiplier or gain stage since, effectively, it amplifies the input signal current or multiplies it by a constant (gain) factor. The static module shown in FIG. 2 has an input 20 which is connected to the junction of a current source 21 and the drain electrode of an n-channel field effect transistor T20. The current source 21 and transistor T20 are connected in series between positive and negative supply rails 22 and 23. The gate electrode of transistor T20 is connected to its drain electrode and to the gate electrode of a further n-channel field effect transistor T21. The source electrodes of transistors T20 and T21 are both connected to the negative supply rail 23. The drain electrode of transistor T21 is connected to the drain electrode of a p-channel field effect transistor T22 whose source electrode is connected to the positive supply rail 22. The drain electrode of transistor T22 is connected to its gate electrode and to the gate electrode of a further p-channel field effect transistor T23 whose source electrode is connected to the positive supply rail 22. The drain electrode of transistor T23 is connected to the drain electrode of an n-channel field effect transistor T24 and to an output terminal 24. A current source 25 is connected between the positive supply rail 22 and the drain electrode of an n-channel field effect transistor T25. The drain electrode of transistor T25 is connected to its gate electrode and to the gate electrode of transistor T24. The source electrodes of transistors T24 and T25 are connected to the negative supply rail 23. Transistors T20 and T21 are identically dimensioned and form a first current mirror circuit having unity gain, that is its input and output currents are equal. The transistors T22 and T23 form a second current mirror circuit but the channel width/length ratio of transistor T23 is A times that of transistor T22 so that the output current from the drain electrode of transistors, T23 is A times the input current applied to the drain electrode of transistor T22. Similarly the transistors T24 and T25 form a third current mirror whose output current from the drain electrode of transistor T24 is A times the input current to the drain of transistor T25, which is arranged by making the channel width/length ratio of transistor T24 A times that of transistor T25.

The current sources 21 and 25 each produce a current j. Thus the input current i at input 20 can have a value up to $-j$ without reverse biassing the input diode connected transistor T20. The input circuit will normally be designed to handle currents of 2j so that the input current i can vary between $\pm j$. When a current i is applied to input 20 the output of the first current mirror formed by transistors T20 and T21 will produce a current $j+i$ in the direction shown in FIG. 2. This current is fed to the input of the second current mirror formed by transistors T22 and T23 which, as a result, produces at its output a current $A.(j+i)$ in the direction shown in FIG. 2. The current j produced by the current source 25 is fed to the input of the third current mirror formed by transistors T24 and T25 which, as a result, produces the current Aj at its output in the direction shown in FIG. 2.

Consequently the current supplied to the output 24 is the difference between the output currents produced by the second and third current mirrors $(A.(j+i)-A.j)$ which is equal to A.i. Consequently, the current at the output 24 is equal to A times the current at the input 20 and the module shown in FIG. 2 provides a current scaling or amplification function.

Within the static module shown in FIG. 2 a bias current j has been added to the input current and a bias current A.j is subtracted from the output current. Thus bidirectional currents can be applied to the input of each module and reproduced at its output. There is a requirement for two matched current sources but these can be located close together within an integrated circuit to minimize mismatches between the currents produced by the two current sources. Further, the provision of the current mirror circuit comprising transistors T24 and T25 enables both current sources to be constructed to produce the same current j., any scaling of the bias currents being achieved by the current mirror circuit. Alternatively, it would be possible to dispense with the current mirror circuit formed by transistors T24 and T25 and to connect the bias current source 25 between the drain electrode of transistor T23 and the negative supply rail 23. In this case, of course, it would be necessary to construct the bias current source 25 to product a current A.j.

Figure 3:
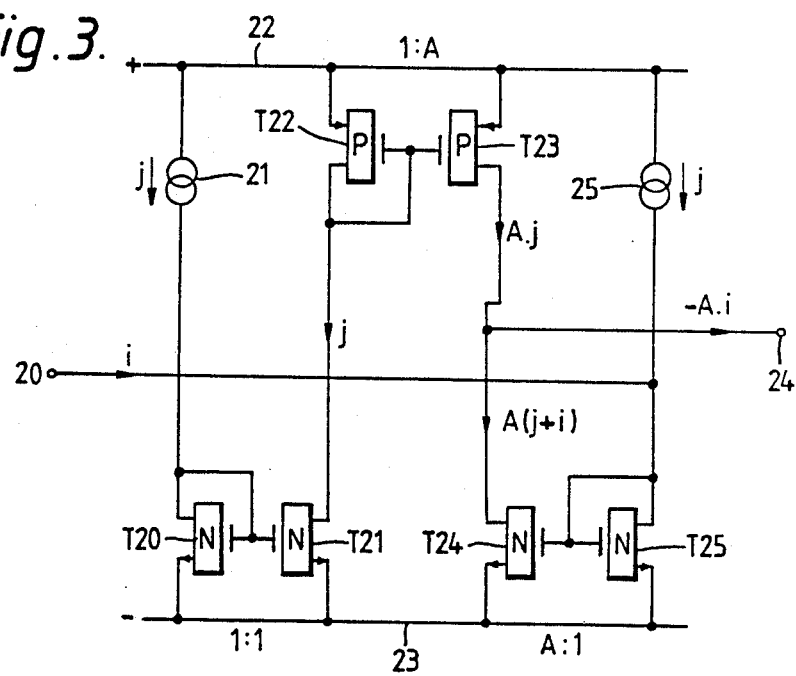
FIG. 3 shows a second embodiment of a static module suitable for use in the arrangement shown in FIG. 1.

FIG. 3 shows a static module which performs the function of an inverting scaler. The arrangement shown in FIG. 3 differs from that shown in FIG. 2 only in that the input 20 is connected to the junction of the current source 25 and the drain of transistor T25 instead of to the junction of the current source 21 and the drain of transistor T20. This modification means that the output of the first current mirror is now equal to j, that of the second current mirror is now equal to Aj, and that of the third current mirror is now equal to $A(i+j)$. Consequently, the output current at output 24 is equal to $-A.i$. Thus, as compared with the arrangement of FIG. 2, a current reversal or inversion has been obtained.

Figure 4:
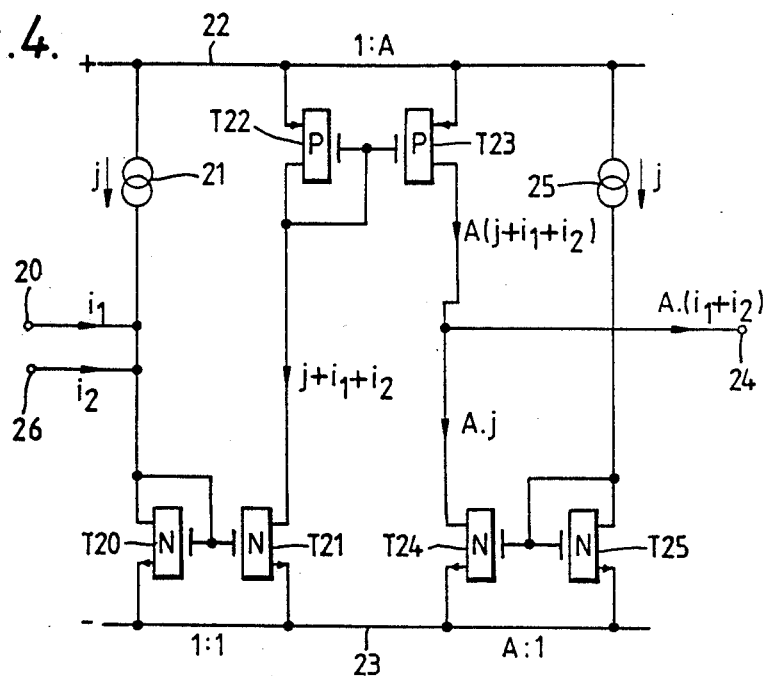
FIG. 4 shows a third embodiment of a static module suitable for use in the arrangement shown in FIG. 1.

FIG. 4 shows a static module which performs the function of a summing scaler. The arrangement shown in FIG. 4 differs from that shown in FIG. 2 only in that a further input 26 is connected to the junction of the current source 21 and the drain electrode of transistor T20. In operation an input current $i_1$ is applied to input 20 and an input current $i_2$ is applied to input 26. As a result a current of $j+i_1+i_2$ is produced at the output of the first current mirror and applied to the input of the second current mirror. Consequently a current of $A(j+i_1+i_2)$ is produced at the output of the second current mirror. As before a current of A.j is produced at the output of the third current mirror. Thus the output at terminal 24, which is the difference between the outputs of the second and third current mirrors, i.e. $(A(j+i_1+i_2)-A.j)$, is equal to $A(i_1+i_2)$.

Figure 5:
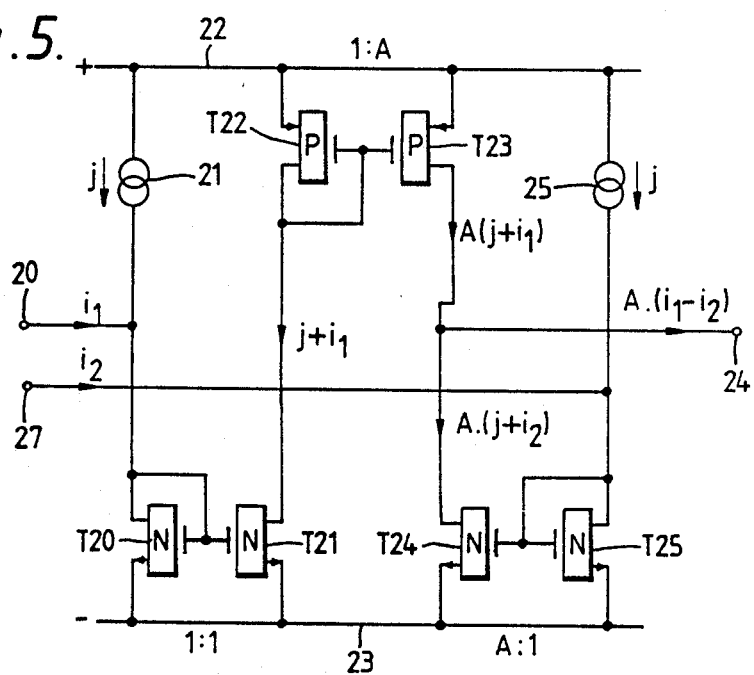
FIG. 5 shows a fourth embodiment of a static module suitable for use in the arrangement shown in FIG. 1.

FIG. 5 shows a static module which performs the function of a subtracting scaler. The arrangement shown in FIG. 5 differs from that shown in FIG. 2 only in that a further input 27 is connected to the junction of the current source 25 and the drain electrode of transistor T25. In operation an input current $i_1$ is applied to input terminal 20 and an input current $i_2$ is applied to input terminal 27. As a result the current produced at the output of the first current mirror is $j+i_1$, the current produced at the output of the second current mirror is $A(j+i_1)$, and the current produced at the output of the third current mirror is $A(j+i_2)$. Consequently the output current at terminal 24, which is the difference between the currents produced by the second and third current mirrors $(A(j+i_1)-A(j+i_2))$, is equal to $A(i_1-i_2)$.

Figure 6:
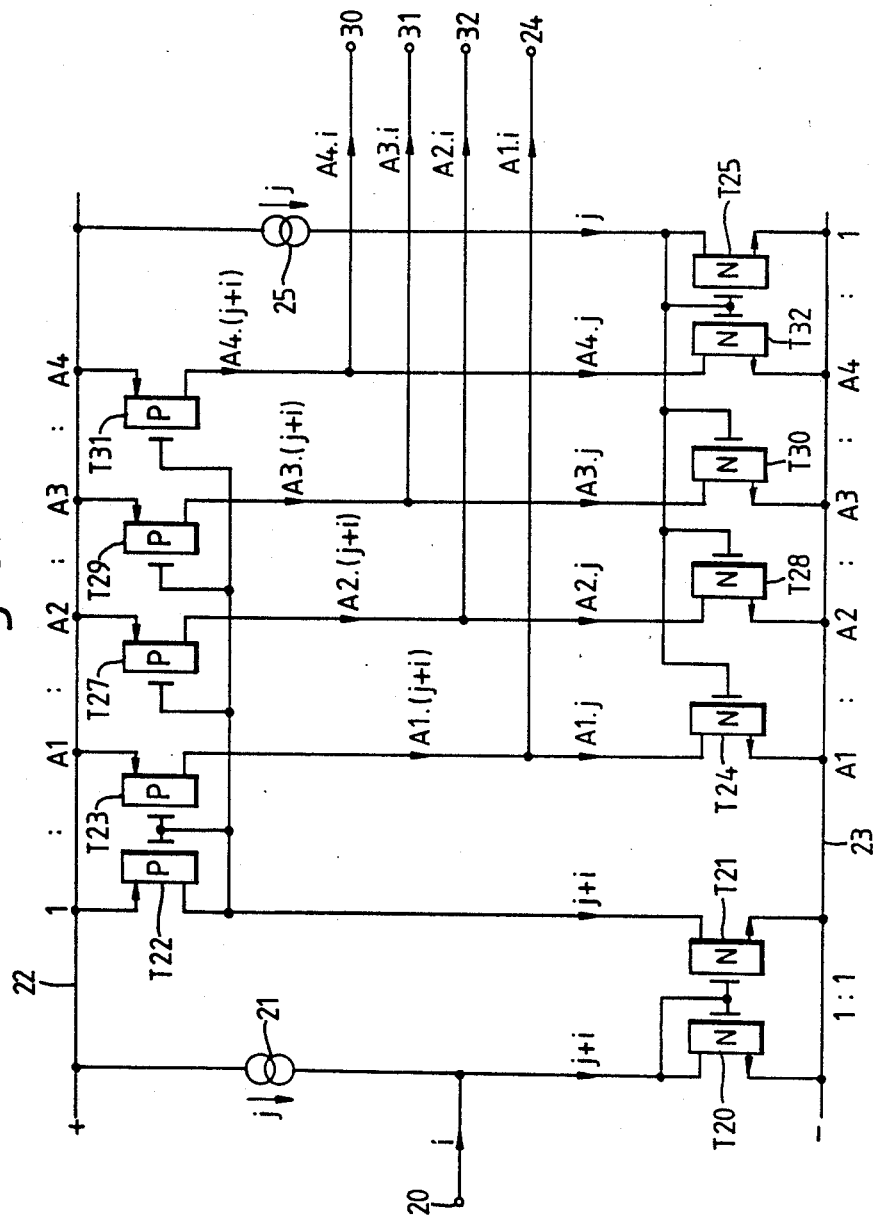
FIG. 6 shows a fifth embodiment of a static module suitable for use in the arrangement shown in FIG. 1.

FIG. 6 shows a static module which performs the function of a multiple scaler or fan-out module. The arrangement shown in FIG. 6 differs from that shown in FIG. 2 only in that the second current mirror and the third current mirror both have multiple outputs and that a plurality of output terminals are provided. The gate electrode of transistor T22 is additionally connected to the gate electrodes of three further p-channel field effect transistors T27, T29 and T31 whose source electrodes are connected to the positive supply rail 22. The channel width/ length ratios of transistors T23, T27, T29 and T31 are, respectively, A1, A2, A3 and A4 times that of transistor T22. The gate electrode of transistor T25 is additionally connected to the gate electrodes of three further n-channel field effect transistors T28, T30 and T32 whose source electrodes are connected to the negative supply rail 23. The channel width/ length ratios of transistors T24, T28, T30 and T32 are, respectively, A1, A2, A3 and A4 times those of transistors T25. The drain electrodes of transistors T31 and T32 are connected to an output terminal 30, the drain electrodes of transisitors T29 and T30 are connected to an output terminal 31, and the drain electrodes of transistors T27 and T28 are connected to an output terminal 32.

When an input current i is applied to input terminal 20 the first current mirror produces a current j+i at its output while the second current mirror produces four currents $A1(j+i)$, $A2(j+i)$, $A3(j+i)$, and $A4(j+i)$, one at each of its four respective outputs. Similarly, the third current mirror produces four output currents $A1.j$, $A2.j$, $A3.j$, and $A4.j$; one at each of its four respective outputs. Consequently, the currents produced at output terminals 24, 30, 31 and 32 are $A1.i$, $A4.i$, $A3.i$ and $A2.i$, respectively.

Clearly the arrangement in FIG. 6 could be modified in the same way as the FIG. 2 arrangement is modified in FIGS. 3 to 5 to produce current summation, subtraction, or inversion.

Figure 7:
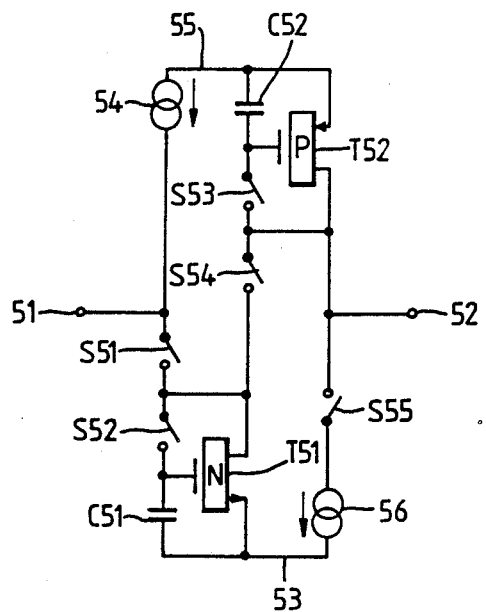
FIG. 7 shows a first embodiment of a current memory module suitable for use in the arrangement shown in FIG. 1.

FIG. 7 shows a current memory module which comprises an arrangement of two analog current memory cells and is also capable of handling bidirectional input currents. It has an input 51 which is connected to one end of a switch S51, the other end of which is connected to the junction of a switch S52 and the drain electrode of an n-channel field effect transistor T51. The other end of the switch S52 is connected to the junction of the gate electrode of the transistor T51 and one plate of a capacitor C51. The other plate of the capacitor C51 is connected to a negative supply rail 53, as is the source electrode of transistor T51. A first current source 54 is connected to a positive supply rail 55 and to the input 51. The drain electrode of transistor T51 is also connected to one end of a switch S54 whose other end is connected to a junction of a switch S53 and the drain electrode of a p-channel field effect transistor T52. The other end of switch S53 is connected to the gate of transistor T52 and to one plate of a capacitor C52 whose other plate is connected to the positive supply rail 55. The source electrode of transistor T52 is also connected to the positive supply rail 55. A second current source 56 is connected between the negative supply rail 53 and one end of a switch S55 whose other end is connected to the drain of transistor T52. An output terminal 52 is connected to the drain of transistor T52.

In operation an input current is applied to terminal 51. If the first current source 54 provides a current j then the input current i may have a range $\pm j$ without causing the diode connected transistor T51 to become reverse biassed. The switches S51, S52 and S55 are closed when a clock signal $\phi$ is present, while the switches S53 and S54 are closed when a clock signal $\bar{\phi}$ is present. When used in a sampled system the clock signals $\phi$ and $\bar{\phi}$ may have a frequency equal to the sampling frequency, the signals $\phi$ and $\bar{\phi}$ being non-overlapping. Thus, for example, $\phi$ may be present during the first half of the sampling period and $\bar{\phi}$ present during the second half of the sampling period. When the clock signal $\phi$ is present switches S51 and S52 are closed and transistor T51 is consequently connected as a diode. A current i+j is conducted through the diode connected transistor T51 and this causes a given gate-source voltage to be produced. The capacitor C51 is charged so that it attains that gate-source voltage. At the end of the period $\phi$ switches S51 and S52 open and at the beginning of the period $\bar{\phi}$ switches S53 and S54 close. The current through transistor T51 will be maintained at the value i+j since the charge on capacitor C51 will maintain the gate-source voltage of transistor T51 constant at the value produced by the input current. When the clock signal the $\bar{\phi}$ is present transistor T52 is connected as a diode and receives the current i+j provided by transistor T51. Similarly the capacitor C52 becomes charged to the gate-source voltage of transistor T52 which is produced by the current that passed through the transistor. On the next $\phi$ clock signal the switches S53 and S54 are opened and the current i+j through transistor T52 is maintained by means of the gate-source voltage provided by the capacitor C52. The switch S55 is closed so that the output current applied to terminal 52 is equal to i+j−j where i+j is the current produced by the transistor T52 and j is the current produced by the current source 56. Thus the output current at 52 is equal to the input current at 51 but is delayed by one sampling period.

The current sources 54 and 56 may be provided as biassed MOS transistors. Clearly in the embodiment shown in FIG. 7 the matching between the two current sources 54 and 56 is critical as any mismatch will be reflected as a difference in current between the input and output. To avoid errors produced by inexact matching between the two current sources 54 and 56, the arrangement shown in FIG. 8 may be used.

Figure 8:
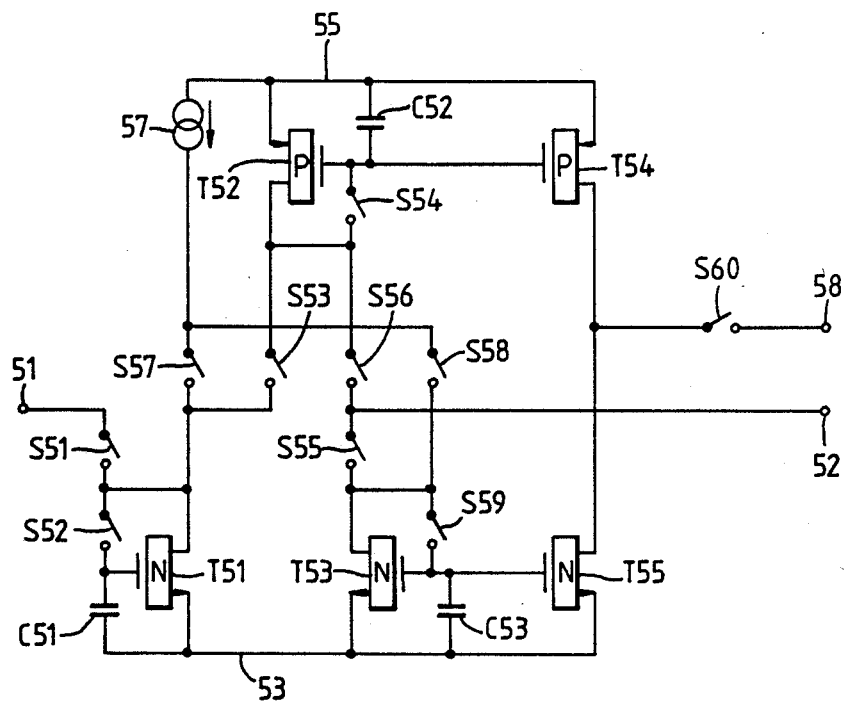
FIG. 8 shows a second embodiment of a current memory module suitable for use in the arrangement shown in FIG. 1.

In FIG. 8 those components which correspond to components of FIG. 7 have been given the same reference labels. FIG. 8 differs from FIG. 7 in that a single current source 57 is used rather than the two current sources 54 and 56, and additional switches and an additional current memory cell are provided to enable the bias current j to be applied to different parts of the current memory. When the clock signal $\phi$ is present switches S51, S52, S55, S56 and S57 are closed. Thus the current i+j is fed to the diode connected transistor T51 as before and its gate-source voltage is stored on capacitor C51. At the end of phase $\phi$ switches S51, S52, S55, S56 and S57 open and a stored current i+j, maintained by the charge on capacitor C51 is produced by transistor T51. At the start of the clock signal $\bar{\phi}$ switches S53, S54, S58 and S59 close. Thus the transistor T52 is connected as a diode and the current i+j is fed to the transistor T52. The capacitor C52 becomes charged to the gate-source voltage produced by the current flowing through the transistor T52. At the same time the current j from the current source 57 is connected to a diode connected transistor T53 and the gate-source voltage of transistor T53 is stored on a capacitor C53. At the end of the clock signal φ switches S53, S54, S58 and S59 are opened while switches S51, S52, S55, S56 and S57 are closed at the start of the next clock signal φ. The current i+j is produced by transistor T52 while the current j is produced by transistor T53 and hence the current i is produced at output 52 during the clock signal φ.

Thus the analog memory shown in FIG. 8 comprises three current memory cells, the cells including transistors T51 and T52 enable the output to be produced during the presence of the clock on signal φ, while the cell including transistor T53 is present merely to store the bias current j for subtraction from the output current.

The circuit arrangement shown in FIG. 8 is also provided with an additional p-channel field effect transistor T54 and an additional n-channel field effect transistor T55. Transistor T54 has its gate electrode connected to the gate electrode of transistor T52 and its source electrode connected to the positive supply rail 55, while transistor T55 has its gate electrode connected to the gate electrode of transistor T53 and its source electrode connected to the negative supply rail 53. The drain electrodes of transistors T54 and T55 are connected to one side of a switch S60 whose other side is connected to an output 58. It can be seen that transistors T54 and T52 form a first current mirror while transistors T53 and T55 form a second current mirror. Thus the current through transistor T54 will mirror that through transistor T52 while the current through transistor T55 will mirror that through transistor T53. If the channel width/ length ratios of transistors T54 and T55 are such that the current ratios between the two branches of the current mirror circuits is 1:A then the current produced at the drain of transistor T54 will be equal to A(i+j) and that at the drain of transistor T55 will be equal to A.j. The switch S60 is closed during the presence of the clock signal φ and hence at that time the current at the output 58 will be equal to $A(i+j)-A.j=A.i$. Clearly a multiple current mirror could be formed giving multiple outputs with selected current ratios. This provides an effective current gain between the input to the analog current memory circuit and a selected output.

By adding a third memory cell comprising the transistor T53, capacitor C53 and the appropriate logical switching, the requirement for two separate current source has been eliminated. Consequently the problem of mismatch between these current sources is also eliminated. Thus by storing the current produced by the current source for distribution through the current memory arrangement the problem of mismatch of current sources can be overcome.

Figure 9:
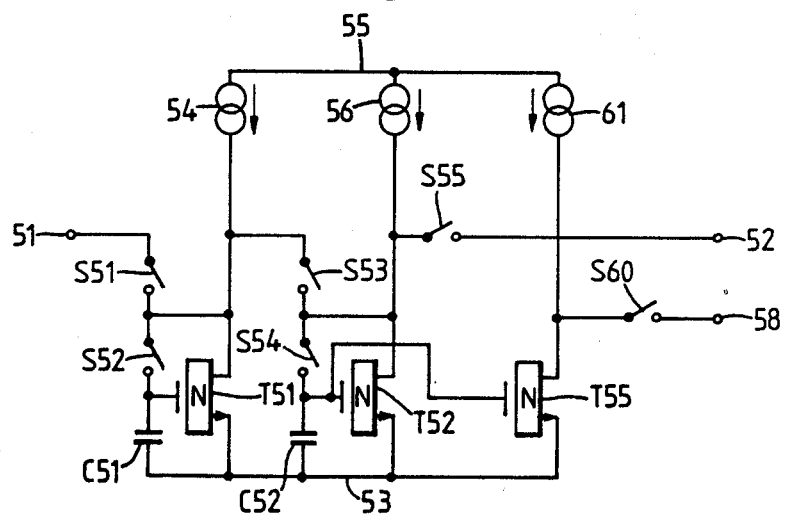
FIG. 9 shows a third embodiment of a current memory module suitable for use in the arrangement shown in FIG. 1.

FIG. 9 shows a further current memory module which uses transistors of one conductivity type only for handling signal currents. It should be noted that in FIGS. 7 and 8 transistor T51 is a n-channel device and transistor T52 a p-channel device.

The arrangement shown in FIG. 9 has an input 51 which is connected via the series arrangement of two switches S51 and S52 to the junction of the gate electrode of an n-channel field effect transistor T51 and a capacitor C51. The other end of the capacitor C51 and the source electrode of transistor T51 are connected to a negative supply rail 53. The drain electrode of transistor T51 is connected to the junction of switches S51 and S52, to a positive supply rail 55 via a current source 54, and to one end of a switch S53. The other end of the switch S53 is connected to one end of a switch S54, to one end of a switch S55, and to the drain electrode of an n-channel field effect transistor T52. The other end of switch S54 is connected to the junction of a capacitor C52 and the gate electrode of transistor T52. The other end of capacitor C52 and the source electrode of transistor T52 are connected to the negative supply rail 53. The drain electrode of transistor T52 is connected to the positive supply rail 55 via a current source 56. The gate electrode of transistor T52 is connected to the gate electrode of a further n-channel field effect transistor T55 whose source electrode is connected to the negative supply rail 53 and whose drain electrode is connected to the positive supply rail 55 via a current source 61. The other end of switch S55 is connected to an output 52 while the drain electrode of transistor T55 is connected to an output 58 via a switch S60.

The arrangement shown in FIG. 9 operates in the following manner. An input current applied to terminal 51 while the clock signal φ is present is fed to the diode connected transistor T51 together with a current j provided by the current source 54 since switches S51 and S52 are closed. This current i+j produces a given gate-source voltage for the transistor T51 which is stored on capacitor C51. When clock signal φ is present switches S51 and S52 are open while switches S53 and S54 are closed. Thus a current $j-(i+j)=-i$ is fed to the diode connected transistor T52 from the junction of the drain electrode of the transistor T51 and the current source 54. At the same time a current +j is fed from the current source 56 so that the transistor T52 has a current of j−i passed through it and its gate-source voltage attains the appropriate value which is then stored on capacitor C52. When the next clock signal φ is present switches S53 and S54 open and switch S55 closes. The current j−i produced by the transistor T52 is subtracted from the current j from the current source 56 and fed through switch S55, which is closed when the clock signal φ is present, to the output 52. Again a multiplied output can be provided at output 58 by the provision of an n-channel field effect transistor T55 which has its gate electrode connected to the gate electrode of transistor T52 and a current source 61 which provides a current of A.j. This is assuming that the channel width/length ratio of transistor T55 is chosen so that the current conducted by transistor T55 is equal to A times that conducted by transistor T52. Thus when the clock signal φ is present switch S60 is closed and the output at output 58 is equal to A.i.

Figure 11:
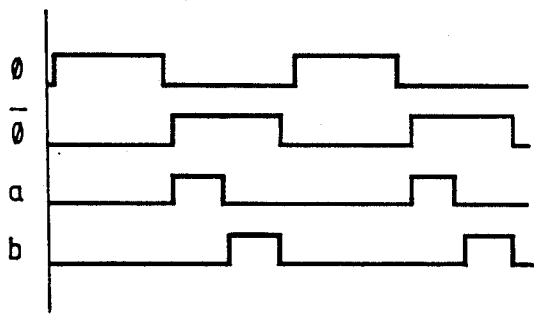
FIG. 11 shows control waveforms for the switches in the current memory module shown in FIG. 10.
Figure 10:
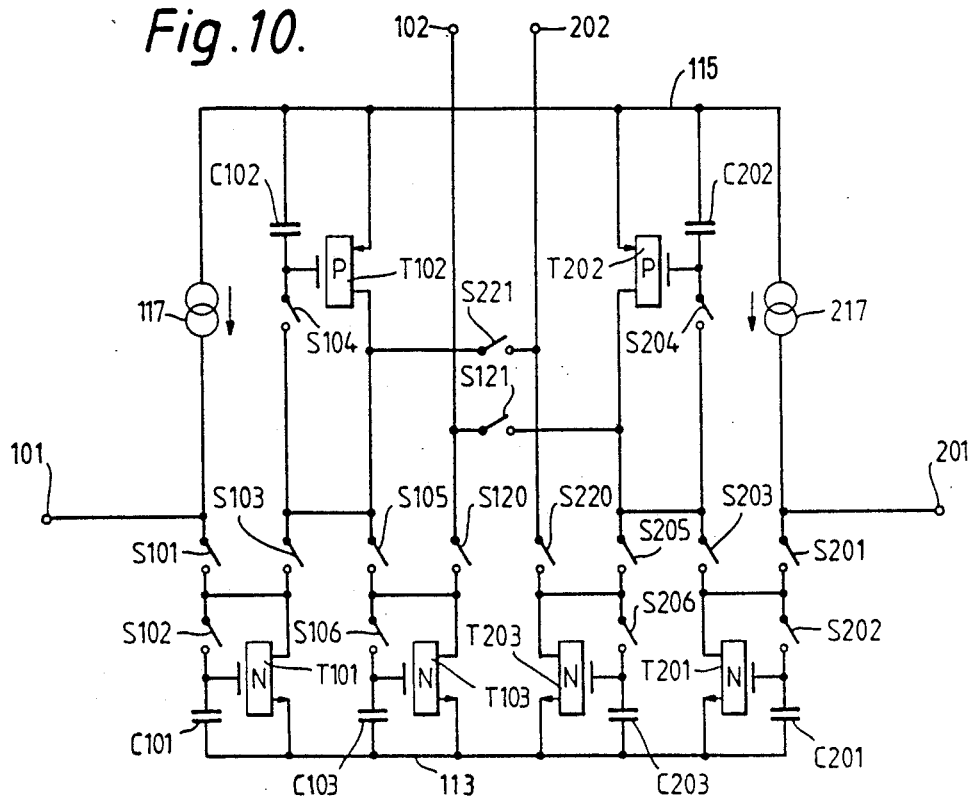
FIG. 10 shows a fourth embodiment of a current memory module suitable for use in the arrangement shown in FIG. 1.

FIG. 10 shows a current memory module having differential inputs and outputs while FIG. 11 shows the control waveforms for the switches shown in FIG. 10.

The arrangement shown in FIG. 10 has a first input 101 which is connected to the junction of a current source 117 and a switch S101. The other end of the current source 117 is connected to a positive supply rail 115 while the other end of the switch S101 is connected to the drain electrode of an n-channel field effect transistor T101. The drain electrode of transistor T101 is connected to its gate electrode via a switch S102 while its source electrode is connected to a negative supply rail 113. A capacitor C101 is connected between the gate electrode of transistor T101 and the negative supply rail 113. The drain electrode of transistor T101 is further connected to the gate electrode of a p-channel field effect transistor T102 via the series arrangement of two switches S103 and S104. The junction of the switches S103 and S104 is connected to the drain electrode of transistor T102. The source electrode of transistor T102 is connected to the positive supply rail 115 while a capacitor C102 is connected between the gate electrode of transistor T102 and the positive supply rail 115. The drain electrode of transistor T102 is connected to the gate electrode of an n-channel field effect transistor T103 via the series arrangement of two switches S105 and S106, the junction of the switches S105 and S106 being connected to the drain electrode of transistor T103. A capacitor C103 is connected between the gate electrode of transistor T103 and the negative supply rail 113 while the source electrode of transistor T103 is also connected to the negative supply rail 113. The drain electrode of transistor T103 is connected via a switch S120 to a first output 102 while the drain electrode of transistor T102 is connected via a switch S221 to a second output 202.

A second input 201 is connected to the junction of a current source 217 and a switch S201. The other end of the current source 217 is connected to the positive supply rail 115 while the other end of the switch S201 is connected to the drain electrode of an n-channel field effect transistor T201. The drain electrode of transistor T201 is connected to its gate electrode via a switch S202 while its source electrode is connected to the negative supply rail 113. A capacitor C201 is connected between the gate electrode of transistor T201 and the negative supply rail 113. The drain electrode of transistor T201 is further connected to the gate of a p-channel field effect transistor T202 via the series arrangement of two switches S203 and S204. The junction of the switches S203 and S204 is connected to the drain electrode of transistor T202. The source electrode of transistor T202 is connected to the positive supply rail 115 while a capacitor C202 is connected between the gate electrode of transistor T202 and the positive supply rail 115. The drain electrode of transistor T202 is connected to the gate electrode of an n-channel field effect transistor T203 via the series arrangement of two switches S205 and S206, the junction of the switches S205 and S206 being connected to the drain electrode of transistor T203. A capacitor C203 is connected between the gate electrode of transistor T203 and the negative supply rail 113 while the source electrode of transistor T203 is also connected to the negative supply rail 113. The drain electrode of transistor T203 is connected via a switch S220 to the second output 202 while the drain electrode of transistor T202 is connected via a switch S121 to the first output 102.

In operation differential input currents $i^+$ and $i^-$ are applied to inputs 101 and 201. When the clock signal $\phi$ is present switches S101, S102, S201 and S202 are closed, while switches S103 and S203 are open. Consequently transistors T101 and T201 are connected as diodes with capacitors C101 and C201 respectively, connected between their gate and source electrodes. As a result when the clock signal $\phi$ is present transistor T101 draws the current $j+i^+$ where $j$ is the current produced by current source 117 and the gate-source voltage attains a value dependent on the magnitude of the current $j+i^+$. While the switches S101 and S102 are closed capacitor C101 charges to the gate-source voltage. Similarly the transistor T201 will conduct the current $j+i^-$ where $j$ is the current produced by the current source 217 and capacitor C201 will be charged to the gate-source potential of transistor T201 produced in response to the application of the current $j+i^-$. At the end of the clock signal $\phi$ the switches S101, S102, S201 and S202 are open and the currents through the transistors T101 and T201 are maintained by charges on the capacitors C101 and C201, respectively. During the period a, which occurs during the first part of the period during which the clock signal $\phi$ is present, switches S103, S104, S203, and S204 are closed. All the other switches are open. Consequently transistors T102 and T202 are connected as diodes and transistor T102 is fed with the current $j+i^+$ produced by transistor T101 while transistor T202 is fed with the current $j+i^-$ produced by the transistor T201. At the end of the period a the switches S103, S104, S203 and S204 are opened but the currents through transistors T102 and T202 are maintained by the voltage provided by the charge on capacitors C102 and C202, respectively, until the start of the next period a. During the period b, which occurs during the second part of the period during which the clock signal $\phi$ is present and which does not overlap the period a, the switches S105, S106, S205 and S206 are closed while all the other switches are open. Consequently the current $j+i^+$ produced by the transistor T102 is fed to the diode connected transistor T103 while the current $j+i^-$ produced by the transistor T202 is fed to the diode connected transistor T203. At the end of the period b switches S105, S106, S205 and S206 open but the currents through transistors T103 and T203 are maintained because the charges accumulated on capacitor C103 and C203 hold the gate-source voltages of those transistors constant until the start of the next b period. When the next cycle of the clock signal $\phi$ occurs switches S120, S121, S220 and S221 are closed. Consequently, the difference between the currents through transistors T203 and T102 is fed to output 202 and the difference between the currents through transistors T103 and T202 is fed to the output 102. As a result when the clock signal $\phi$ is present the current $-(i^+-i^-)$ is produced at the output 102 while the current $(i^+-i^-)$ is produced at output 202.

The operation of the circuit may be summarised in the following manner. When the clock signal $\phi$ is present the currents $j+i^+$ are stored on transistor T101 and $j+i^-$ are stored on transistor T201. On the next a phase these currents are stored on transistors T102 and T202 respectively, and on the next b phase they are additionally stored on transistors T103, and T203 respectively. Consequently on the next cycle of the clock signal transistor T102 stores a current $i_2$ equal to $j+i^+$ while transistor T203 stores a current $i_3$ equal to $j+i^-$. Similarly transistor T103 stores a current $i_4$ equal to $j+i^-$ while transistor T202 stores a current $i_5$ equal to $j+i^-$. When the output switches S120, S220, S121 and S221 close, the output current at outputs 102 and 202 are equal to $i_4-i_5$ and $i_2-i_3$ so that the output current at output 102 is equal to $-(i^+-i^-)$ and the output current at output 202 is equal to $(i^+-i^-)$.

It should be noted that the inputs 101 and 201 are sampled when the clock signal $\phi$ is present and the output is only valid when the clock signal $\phi$ is present. This is acceptable in most circumstances. For example, when such a memory is used in switched current circuits the same techniques of having a reset phase, as is used in many switched capacitor circuits, may be employed. In that case it is only necessary that inputs and outputs are valid during the presence of the clock signal $\phi$. However, if it is required to have an output over the whole sample period then the circuit arrangement shown in FIG. 12 may be used.

Figure 12:
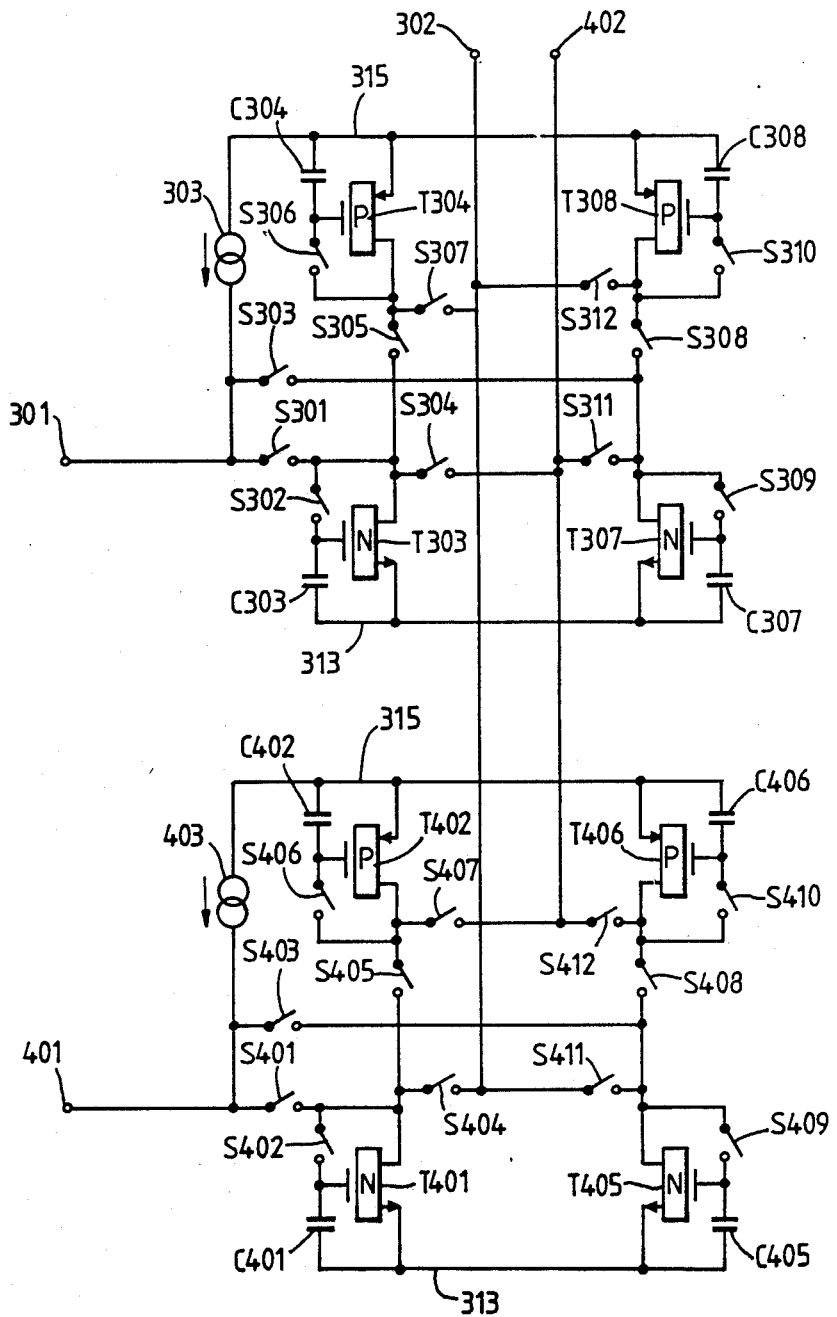
FIG. 12 shows a fifth embodiment of a current memory module suitable for use in the arrangement shown in FIG. 1.

The current memory module shown in FIG. 12 has two inputs 301 and 401 to which the currents $i^+$ and $i^-$ are applied and two outputs 302 and 402 from which the currents $(i^+-i^-)$ and $-(i^+-i^-)$ are produced. The input 301 is connected to the junction of a first switch S301, a second switch S303, and a current source 303. The other end of the current source 303 is connected to a positive supply rail 315. The other end of the first switch S301 is connected to a further switch S302, to the drain electrode of an n-channel field effect transistor T303, and to a switch S304. The other end of the switch S302 is connected to the junction of the gate of n-channel field effect transistor T303 and a capacitor C303 whose other end is connected to a negative supply rail 313. The drain electrode of transistor T303 is also connected to one end of a switch S305 whose other end is connected to the junction of the drain electrode of a transistor T304 and to two further switches S306 and S307. The other end of switch S306 is connected to the gate electrode of transistor T304 and a capacitor C304, the other end of which is connected to the positive supply rail 315. The other end of switch S303 is connected to the drain electrode of a p-channel field effect transistor T307 and via a switch S308 to the drain electrode of a p-channel field effect transistor T308. The drain electrode of transistor T307 is connected via a switch S309 to its gate electrode and to one end of a capacitor C307 whose other end is connected to the negative supply rail 313. The drain electrode of transistor T308 is connected to its gate electrode via a switch S310, the gate electrode being also connected to the one end of a capacitor C308 whose other end is connected to the positive supply rail 315. The drain electrode of transistor T303 is connected via the series arrangement of two switches S304 and S311 to the drain electrode of the transistor T307. The junction of the switches S304 and S311 is connected to the output 402. The drain electrode of transistor T304 is connected to the drain electrode of transistor T308 via the series arrangement of two switches S307 and S312. The junction of the switches S307 and S312 is connected to the output 302. The source electrodes of transistors T303 and T307 are connected to the negative supply rail 313 while the source electrodes of transistors T304 and T308 are connected to the positive supply rail 315.

The lower half of the circuit shown in FIG. 12 is similar to the upper half. The difference between the two halves is that the junction of the switches S407 and S412 in the lower half, which correspond to the switches S307 and S312 in the upper half, is connected to output 402 rather than to output 302. Similarly the junction of switches S404 and S411, which corresponds to the switches S304 and S311 in the upper half, is connected to output 302 rather than to output 402.

Figure 13:
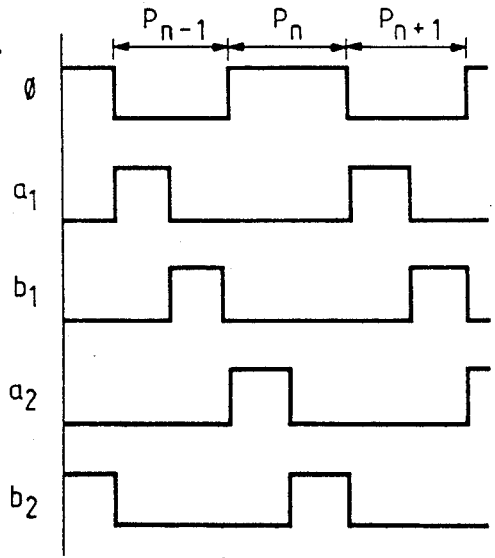
FIG. 13 shows control waveforms for the switches in the current memory module shown in FIG. 12.

FIG. 13 shows the various clock waveforms which are applied to the switches in the circuit of FIG. 12. Switches S304, S307, S404 and S407 are closed only when the signal $\phi$ is present, switches S311, S312, S411 and S412 are closed only when the signal $\phi$ is not present, switches S301, S302, S401 and S402 are closed only when the signal $a_1$ is present, switches S305, S306, S405 and S406 are closed only when the signal $b_1$ is present, switches S303, S309, S403 and S409 are closed only when the signal $a_2$ is present, and switches S308, S310, S408 and S410 are closed only when the signal $b_2$ is present. Each switch is open when its controlling signal is not present.

As shown in FIG. 13 it is assumed that the signal $\phi$ is present during alternate sample periods. Further it is assumed that input currents $i^+$ and $i^-$ are $i^+_{n-1}$ and $i^-_{n-1}$ in sample period $p_{n-1}$, $i^+n$ and $i^-_n$ in sample period $p_n$ and $i^+_{n+1}$ and $i^-_{n+1}$ in sample period $P_{n+1}$.

During phase $a_1$ of the sample period $P_{n-1}$ switches S301 and S302 are closed and consequently a current $j+i^+_{n-1}$ is applied to the diode connected transistor T303, where j is the current produced by current source 303. Similarly the current $j+i^-_{n-1}$ is applied to the diode connected transistor T401, where j is the current produced by the current source 403. During the phase $b_1$ of the sample period $P_{n-1}$ switches S305 and S306 (and S405 and S406) are closed and switches S301 and S302 (and S401 and S402) are open. The charge on capacitor C303 (and C401) maintains the current $j+i^+_{n-1}$ through transistor T303 (and the current $j+i^-_{n-1}$ through transistor T401). Consequently the current $j+i^+_{n-1}$ is applied to the diode connected transistor T304 (and the current $j+i^-_{n-1}$ is applied to the diode connected transistor T402). The switches S304, S307, S404 and S407 are all open and hence the currents $j+i^+_{n-1}$ and $j+i^-_{n-1}$ are isolated from the outputs 302 and 402.

During phase $a_2$ of the sample period $P_n$ switches S303, S309, S403, and S409 are closed and consequently the current $j+i^+_n$ is applied to the diode connected transistor T307 and the current $j+i^-_n$ is applied to the diode connected transistor T405. During phase $b_2$ of the sample period $P_n$ switches S303, S309, S403, and S409 are open and switches S308, S310, S408, and S410 are closed. The charges on capacitors C307 and C405 maintain the currents $j+i^+_n$ and $j+i^-_n$ through transistors T307 and T405, respectively. Consequently the diode connected transistor T308 receives the current $j+i^+_n$ and the diode connected transistor T406 receives the current $j+i^-_n$. The switches S311, S312, S411 and S412 are all open and hence the currents $j+i^+_n$ and $j+i^-_n$ are isolated from the outputs 302 and 402. However, the switches S304, S307, S404, and S407 are closed and hence the currents $j+i^+_{n-1}$ and $j+i^-_{n-1}$ are connected to the outputs 302 and 402. The output 302 receives the current $j+i^+_{n-1}$ via switch S307 and $-(j+i^-_{n-1})$ via switch S404. Consequently the output current at output 302 during sample period Pn is $(j+i^+_{n-1})-(j+i^-_{n-1})=i^+_{n-1}-i^-_{n-1}$. Similarly the output current at ouput 402 during sample period Pn is $-(i^+_{n-1}-i^-_{n-1})$. That is the differential output currents are equal to the difference of the input currents during the preceding sample period.

At the start of the sampling period $P_{n+1}$ switches S301, S302, S401 and S402 are closed and the currents $j+i^+_{n-1}$ and $j+i^-_{n-1}$ are fed to the diode connected transistors T303 and T401, respectively. Switches S304, S307, S404 and S407 are open and hence the currents produced by transistors T303, T304, T401 and T402 are isolated from the outputs 302 and 402. Switches S311, S312, S411 and S412 are closed and hence the currents produced by the transistors T307, T308, T405, and T406 are fed to the outputs 302 and 402 which consequently conduct the currents $i^+_n-i^-_n$ and $-(i^+_n-i^-n)$ during the sample period $P_{n+1}$. Thus during the period $P_{n+1}$ the currents $j+i^+_{n+1}$ and $j-i^-_{n+1}$ are sampled and stored on transistors T303, T304, T401 and T402 and the currents $j+i^+_n$ and $j+i^-_n$ stored on transistors T307, T308, T405 and T406 are coupled to the outputs 302 and 402 via switches S311, S312, S411, and S412, respectively.

As a result the input current supplied during sampling period $P_n$ is available at the output for the whole of the sampling period $P_{n+1}$. The arrangement is in effect two memories acting sequentially with multiplexed outputs, the first memory including transistors T303 and T304 (T401 and T402) and the second memory including transistors T307 and T308 (T405 and T406).

Figure 14:
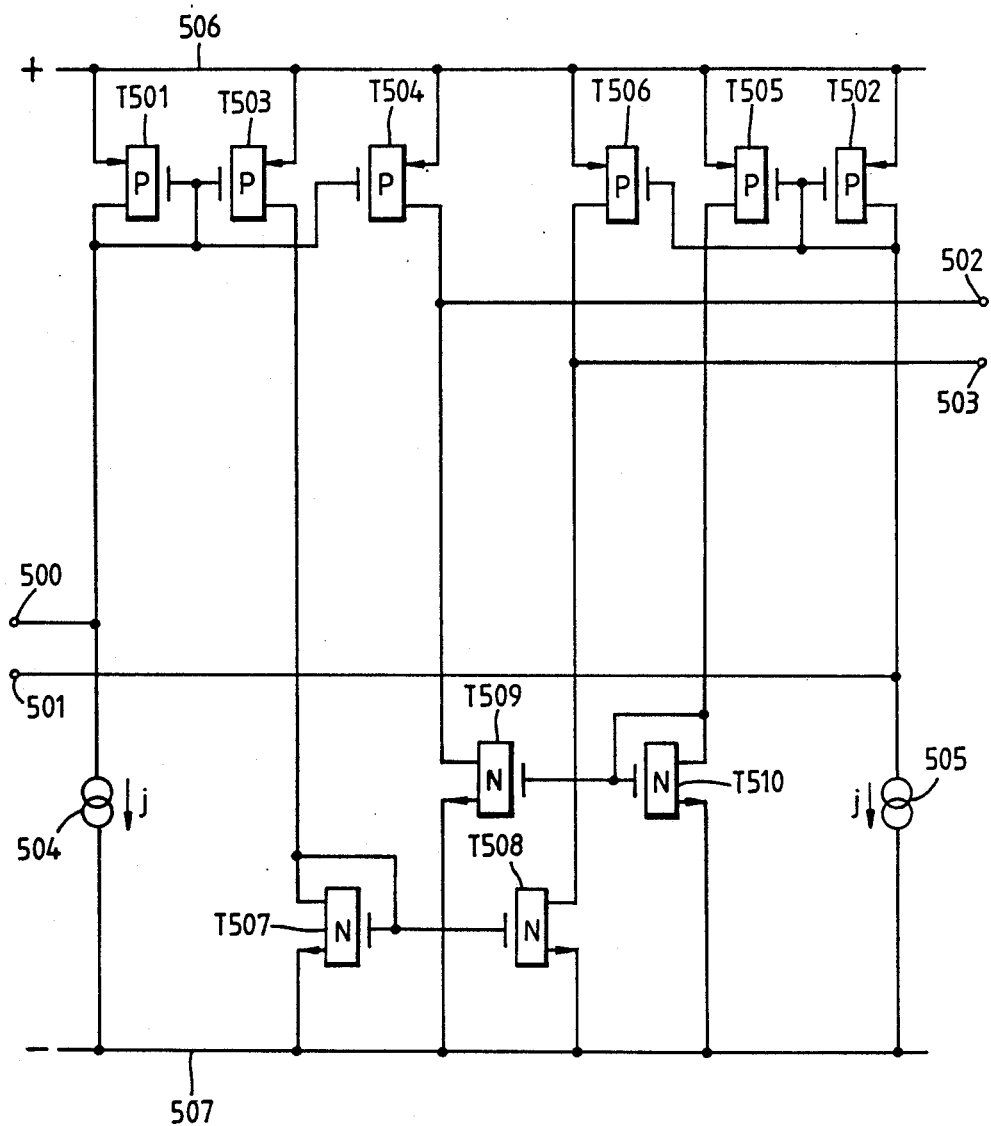
FIG. 14 shows a sixth embodiment of a static module suitable for use in the arrangement shown in FIG. 1.

FIG. 14 shows a static module which performs the function of a scaler and has a differential current input and a differential current output. The static module shown in FIG. 14 has two input terminals 500, 501 for receiving a differential current input $i^+, i^-$ and two output terminals 502, 503 at which a differential current output $A.i^+, A.i^-$ is produced. The input terminal 500 is connected to the junction of a current source 504 and the drain electrode of a p-channel field effect transistor T501 while the input terminal 501 is connected to the junction of a current source 505 and the drain electrode of a p-channel field effect transistor T502. The source electrodes of transistors T501 and T502 are connected to a positive supply rail 506 while the other ends of the current sources 504 and 505 are connected to a negative supply rail 507. The drain electrode of transistor T501 is connected to its gate electrode and to the gate electrodes of two further p-channel field effect transistors T503 and T504 whose source electrodes are connected to the positive supply rail 506. Similarly the drain electrode of transistor T502 is connected to its gate electrode and to the gate electrodes of two further p-channel field effect transistors T505 and T506 whose source electrodes are connected to the positive supply rail 506. The drain electrode of transistor T503 is connected to the drain and gate electrodes of an n-channel field effect transistor T507 and to the gate electrode of a further n-channel field effect transistor T508. The source electrodes of transistors T507 and T508 are connected to the negative supply rail 507. The drain electrode of transistor T504 is connected to the output terminal 502 and to the drain electrode of an n-channel field effect transistor T509 whose gate electrode is connected to the gate and drain electrodes of a further n-channel field effect transistor T510. The source electrodes of transistors T509 and T510 are connected to the negative supply rail 507. The drain electrode of transistor T505 is connected to the drain electrode of transistor T510 while the drain electrode of transistor T506 is connected to the output terminal 503 and to the drain electrode of transistor T508.

Transistor T501, T503 and T504 form a first current mirror circuit having an input branch formed by the diode connected transistor T501 and two output branches formed by transistors T503 and T504, respectively. The channel width/length ratios of transistors T503 and T504 are chosen to give respective current gains of unity and A. Transistors T502, T505 and T506 form a second current mirror circuit having an input branch formed by the diode connected transistor T502 and two output branches formed by transistors T505 and T506, respectively. The channel width/length ratios of transistors T505 and T506 are chosen to give respective current gains of unity and A. Transistors T507 and T508 form a third current mirror, the diode connected transistor T507 forming the input branch and transistor T508 forming the output branch. The channel width/length ratios of transistors T507 and T508 are chosen to give the current mirror circuit a current gain of A. Similarly transistors T510 and T509 form a fourth current mirror circuit having a gain of A between the input branch formed by the diode connected transistor T510 and the output branch formed by transistor T509.

In operation differential currents $i^+$ and $i^-$ are fed to inputs 500 and 501, respectively. As a result a current $j - i^-$ is applied to the input branch of the first current mirror and a current of $j - i^-$ is applied to the input branch of the second current mirror, where j is the current produced by the current sources 504 and 505. This causes the current $j - i^+$ to be applied to the input of the third current mirror circuit and the current $j - i^-$ to be applied to the input of the fourth current mirror circuit. Consequently the output of the fourth current mirror circuit produces the current $A.(j - i^-)$ which is subtracted from the current $A.(j - i^+)$ produced at the second output of the first current mirror circuit to produce the current $-A.(i^+ - i^-)$ at the output terminal 502. Similarly the output of the third current mirror circuit produces the current $A.(j - i^+)$ which is subtracted from the current $A.(j - i^-)$ produced at the second output of the third current mirror circuit to produce the current $A.(1^+-1)$ at the output terminal 503.

Thus the static module shown in FIG. 14 provides a differential output current from a differential input current and produces a given current gain A which depends on the channel width/length ratios of the transistors forming the current mirror circuits. The advantage of the differential modules is in their suppression of common mode input signals and reduced susceptibility to power supply noise signals. This is of particular advantage when an analog signal processing circuit is integrated on the same substrate as a digital signal processing circuit.

Figure 15:
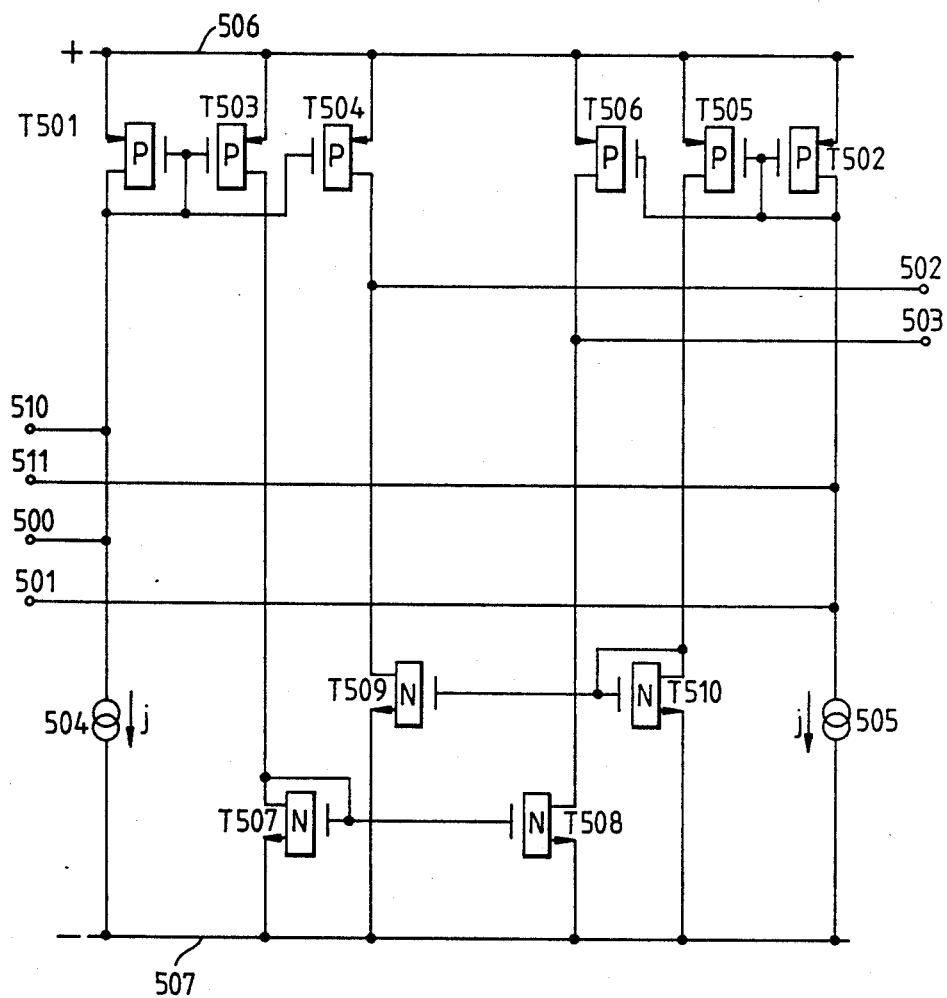
FIG. 15 shows a seventh embodiment of a static module suitable for use in the arrangement shown in FIG. 1.

FIG. 15 shows a static module which performs the function of adding two differential input currents. The arrangement shown in FIG. 15 differs from that shown in FIG. 14 only in that two additional input terminals 510 and 511 are provided, terminal 510 being connected to the junction of the current source 504 and the drain electrode of transistor T501 and terminal 511 being connected to the junction of the current source 505 and the drain electrode of transistor T502.

In operation two input signals $i_1$ and $i_2$, both in differential form, are applied to terminals 500 and 501 and 510 and 511 respectively, i.e. $i_1^+$ and $i_1^-$ to terminals 500 and 501 and $i_2^+$ and $i_2^-$ to terminals 510 and 511. Consequently the current fed to the input branch of the first current mirror circuit is $j - (i_1^+ + i_2^+)$ and the current fed to the input branch of the second current mirror circuit is $j - (i_1^- + i_2^{31})$. As a result the current drawn from the output branch of the first current mirror formed by transistor T504 is $A(j - [i_1^+ + i_2^+])$ and that drawn from the output of the second current mirror circuit formed by transistor T506 is $A(j - [i_1^- + i_2^-])$. The fourth current mirror circuit produces the current $A(j - [i_1^- + i_2^-])$ which is subtracted from the current produced by the first current mirror to give an output current at terminal 502 of $A(j - [i_1^+ + i_2^+]) - A(j - [i_1^- + i_2^-])$ which is equal to $-A(i_1^+ + i_2^+ - i_1^- - i_2^-)$ which is equivalent to $-A(i_1 + i_2)$. Similarly the third current mirror circuit produces the current $A(j - (i_1^+ + i_2^+))$ which is subtracted from the current produced by the second current mirror to give an output current at terminal 503 of $A(j - [i_1^- - i_2^-]) - A(j - [i_1^+ + i_2^+])$ which is equal to $A(i_1^+ - i_1^- + i_2^+ - i_2^-)$ which is equivalent to $A(i_1 + i_2)$.

If the connections to input terminals 510 and 511 are reversed, i.e. $i_2^-$ is connected to terminal 510 and $i_2^+$ is connected to terminal 511, then the output currents at terminals 502 and 503 will be $-A(i_1-i_2)$ and $A(i_1-i_2)$ respectively and a subtracting scaler is obtained. Furthermore an inversion is obtained if the output terminals are reversed.

Figure 16:
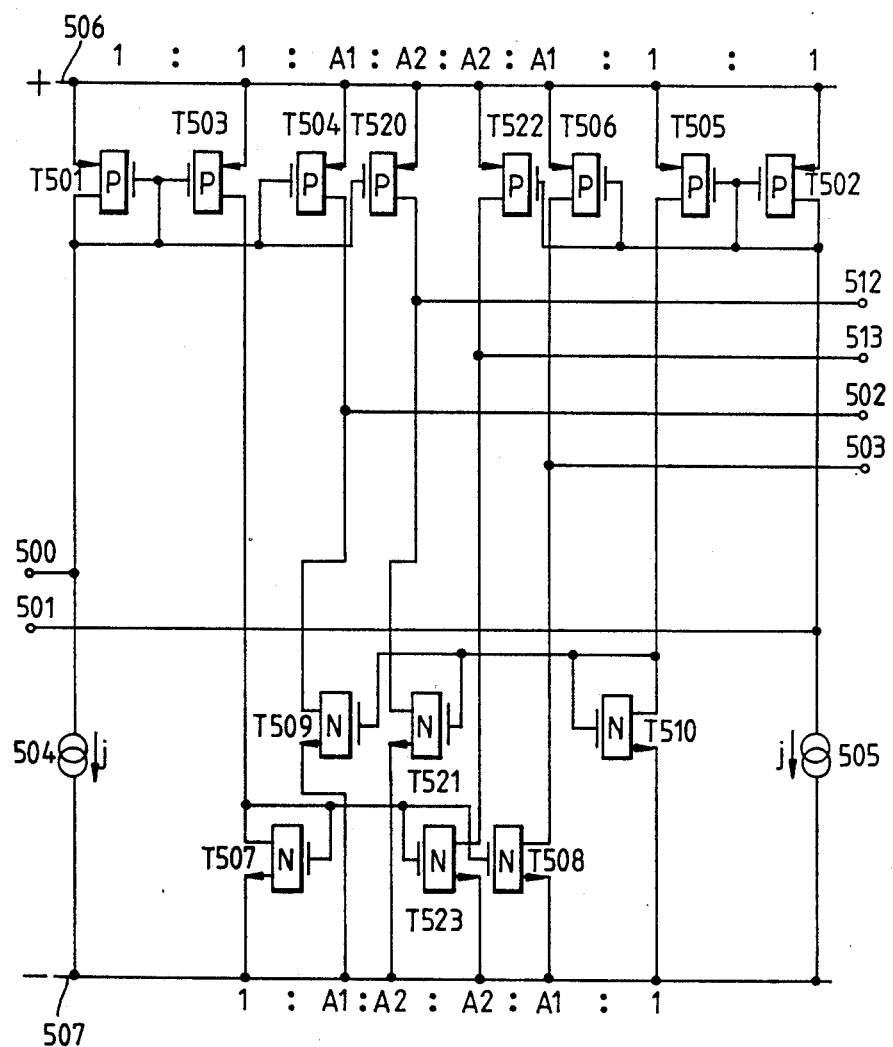
FIG. 16 shows an eighth embodiment of a static module suitable for use in the arrangement shown in FIG. 1.

FIG. 16 shows a static module which performs the function of scaling a differential current input and producing two differential current outputs. The scaler shown in FIG. 16 is similar to that shown in FIG. 14 and common elements are given the same reference labels. The arrangement differs from that shown in FIG. 14 in that the first current mirror circuit has a third output branch formed by a p-channel field effect transistor T520, the second current mirror circuit has a third output branch formed by a p-channel field effect transistor T522, the third current mirror circuit has a second output branch formed by an n-channel field effect transistor T523, and the fourth current mirror circuit has a second output branch formed by an n-channel field effect transistor T521. The junction of the drain electrodes of transistors T520 and T521 is connected to an output terminal 512, and the junction of the drain electrodes of transistors T522 and T523 is connected to an output terminal 513. The first and second current mirror circuits are constructed so that the current gain from the input to the first output is unity, that from the input to the second output is A1 and that from the input to the third output is A2. The third and fourth current mirror circuits are constructed such that the gain from the input to the first output is A1 and that from the input to the second output is A2.

It can readily be deduced that the output currents at terminals 502 and 503 are $-A1(i^+-i^{31})$ and $A1(i^+-i^-)$ and at terminals 512 and 513 are $-A2(i^+-i^-)$ and $A2(i^+-i^-)$. Clearly still more outputs could be provided by adding further output branches to the four current mirror circuits and the gain from the input to each output can be given any practical arbitary value. Similarly the additional current mirror branches shown in FIG. 16 could be added to the summing and subtracting scalers described with reference to FIG. 15. A mixture of inverting and non-inverting outputs can be obtained by reversing selected pairs of output terminals.

Figure 17:
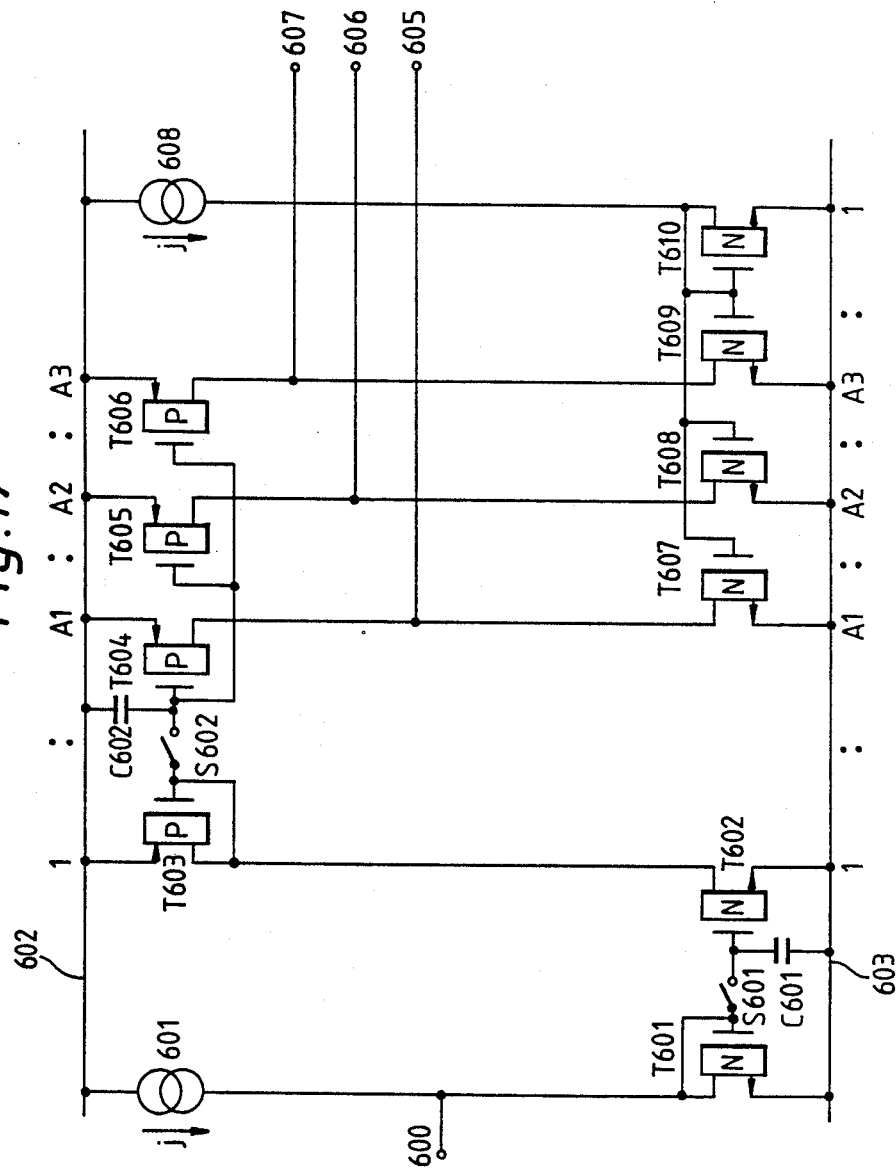
FIG. 17 shows a sixth embodiment of a current memory module suitable for use in the arrangement shown in FIG. 1.

FIG. 17 shows an alternative memory module. The arrangement shown in FIG. 17 has an input 600 which is connected to the junction of a current source 601 and the drain electrode of an n-channel field effect transistor T601. The other end of the current source 601 is connected to a positive supply rail 602 while the source electrode of transistor T601 is connected to a negative supply rail 603. The drain electrode of transistor T601 is additionally connected to its gate electrode and to one end of a switch S601 whose other end is connected to the junction of a capacitor C601 and the gate electrode of a further n-channel field effect transistor T602. The other plate of capacitor C601 and the source electrode of transistor T602 are connected to the negative supply rail 603. The drain electrode of transistor T602 is connected to the drain electrode of a p-channel field effect transistor T603 whose source electrode is connected to the positive supply rail 602. The gate electrode of transistor T603 is connected to its drain electrode and to one end of a switch S602 whose other end is connected to the junction of a capacitor C602 and the gate electrode of a further p-channel field effect transistor T604. The other plate of capacitor C602 is connected to the positive supply rail 602 though it could without affecting the circuit operation be connected to the negative supply rail 603. The gate electrode of transistor T604 is connected to the gate electrodes of two further p-channel field effect transistors T605 and T606. The source electrodes of transistors T604, T605 and T606 are all connected to the positive supply rail 602. The drain electrode of transistor T604 is connected to the drain electrode of an n-channel field effect transistor T607 and to an output 605 while the drain electrode of transistor T605 is connected to the drain electrode of a further n-channel field effect transistor T608 and to an output terminal 606 and the drain electrode of transistor T606 is connected to the drain electrode of a further n-channel field effect transistor T609 and to an output terminal 607. A current source 608 is connected between the positive supply rail 602 and the drain electrode of an n-channel field effect transistor T610. The drain electrode of transistor T610 is connected to its gate electrode and to the gate electrodes of transistors T607, T608 and T609. The source electrodes of transistors T607, T608, T609 and T610 are each connected to the negative supply rail 603.

Figure 18:
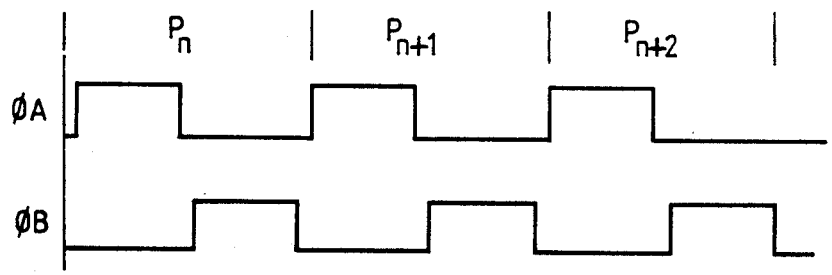
FIG. 18 shows control waveforms for the switches in the current memory module shown in FIG. 17.

The operation of the memory module shown in FIG. 17 will be explained with reference to FIG. 18 which shows the relationship of clock signals $\phi A$ and $\phi B$ to sample periods $P_n$, $P_{n+1}$, etc. A sampled current $i_n$ is applied to input 600 in sampling period $P_n$. The switches S601 and S602 are operated by two non-overlapping clock signals $\phi A$ and $\phi B$, respectively, so that switch S601 is closed in a first portion of each sampling period when the signal $\phi A$ is present and switch S602 is closed in a second portion of each sampling period when the signal $\phi B$ is present. When the signal $i_n$ is applied to input 600 the input branch of the current mirror circuit formed by transistors T601 and T602 (when switch S601 is closed) receives the current $j+i_n$. This causes the capacitor C601 to become charged to the gate source voltage of transistors T601 and T602. At the end of the $\phi A$ phase of the sampling period $P_n$ the switch S601 opens but the current through transistor T602 is maintained by the charge on capacitor C601. Thus when switch S601 opens the current through transistor T602, which is fed to the input of the current mirror circuit formed by transistors T603 and T604 (when switch S602 is closed), is equal to $j+i_n$. During phase $\phi B$ of sampling period Pn the switch S602 is closed and capacitor C602 charges to the gate-source potential of transistors T603 and T604 and at the end of phase $\phi B$ when switch S602 opens the charge on capacitor C602 maintains the current through transistor T604 at the value $A1(j+i_n)$ where A1 is the gain of the current mirror circuit formed by transistors T603 and T604. The current mirror circuit formed by transistors T610 and T607 receives the current j from the current source 608 and produces the current A1.j in its output branch and consequently the current at the output 605, which is the difference between the currents through transistors T604 and T607, is equal to $A1(j+i_n)-A1j = A1.i_n$. This current is available at output 605 during phase $\phi A$ of sampling period $P_{n+1}$. During phase $\phi B$ of sampling period $P_n$ the current at output 605 will not be constant (or valid) since capacitor C602 will take a finite time to charge to the required gate-source potential and hence the output current will take a finite time to settle. The time $\phi B$ is arranged to be sufficiently long for the capacitor C602 to charge to the correct potential, as also the time $\phi A$ is arranged to be sufficiently long to allow capacitor C601 to charge to the required gate-source potential of transistors T601 and T602. Transistors T605 and T606 are further output branches of the current mirror circuit whose input branch is formed by transistor T603 and in conjunction with the further output branches formed by transistors T608 and T609 of the current mirror circuit whose input branch is formed by transistor T610 produce two further outputs $A2.i_n$ and $A3.i_n$ in sample period $P_{n+1}$.

Thus the arrangement shown in FIG. 17 provides an output current delayed by one sample period with respect to the input current and is capable of producing a bidirectional current output from a bidirectional current input provided that the current excursion is less than the bias current provided by the current sources 601 and 608 which, of course, have to be matched.

Figure 19:
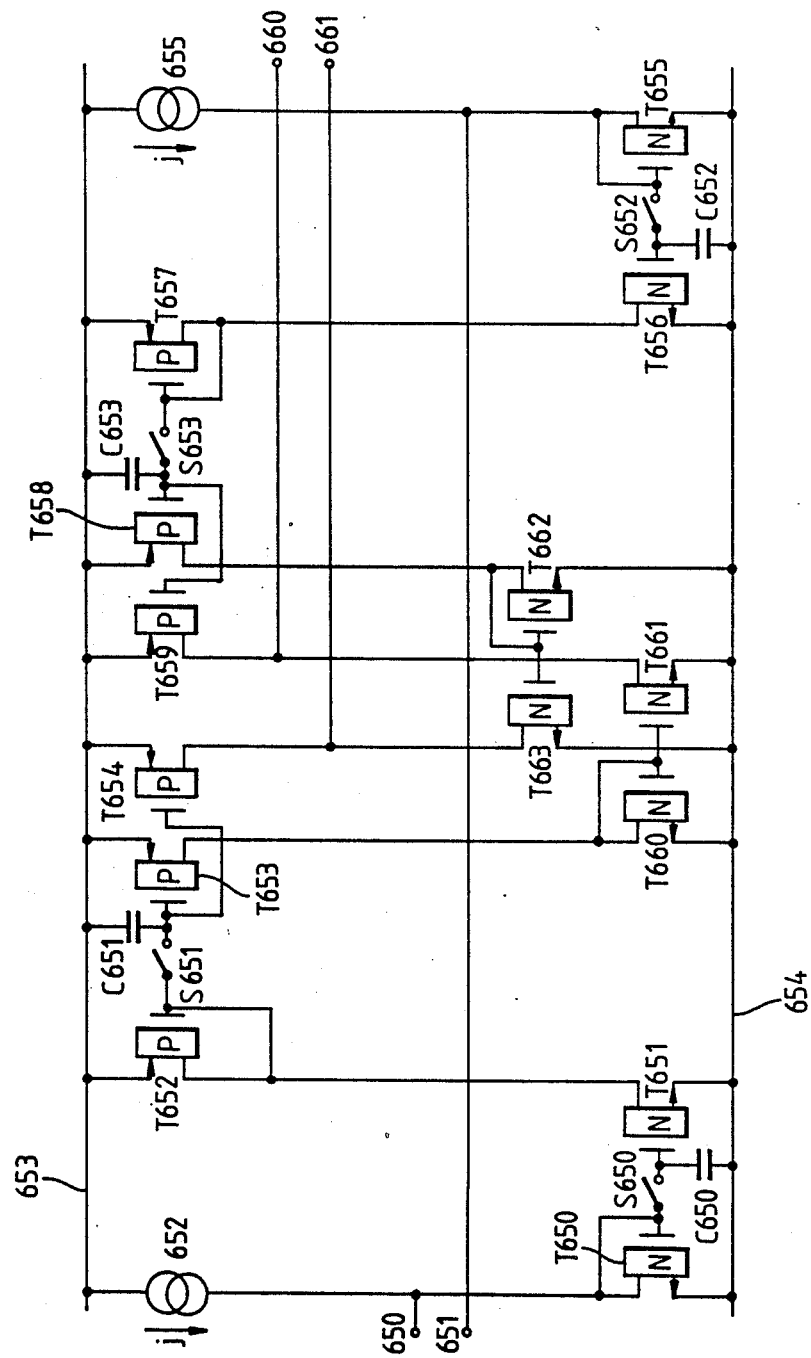
FIG. 19 shows a seventh embodiment of a current memory module suitable for use in the arrangement shown in FIG. 1.

FIG. 19 shows a version of the memory module shown in FIG. 17 suitable for differential current inputs and outputs. The arrangement shown in FIG. 19 has two input terminals 650 and 651. The input 650 is connected to the junction of a current source 652 and the drain electrode of an n-channel field effect transistor T650. The other end of the current source 652 is connected to a positive supply rail 653 while the source electrode of transistor T650 is connected to a negative supply rail 654. The drain electrode of transistor T650 is connected to its gate electrode and to one end of a switch S650 whose other end is connected to the junction of a capacitor C650 and the gate electrode of an n-channel field effect transistor T651. The other plate of the capacitor and the source electrode of transistor T651 are both connected to the negative supply rail 654. The drain electrode of transistor T651 is connected to the drain electrode of a p-channel field effect transistor T652 whose source electrode is connected to the positive supply rail 653. The gate electrode of transistor T652 is connected to its drain electrode and to one side of a switch S651 whose other side is connected to the junction of a capacitor C651 and the gate electrode of two p-channel field effect transistors T653 and T654. The other plate of capacitor C651 is connected to the positive supply rail 653 while the source electrodes of transistors T653 and T654 are connected to the positive supply rail 653.

The input 651 is connected to the junction of a current source 655 and the drain electrode of an n-channel field effect transistor T655. The other end of the current source 655 is connected to the positive supply rail 653 while the source electrode of transistor T655 is connected to the negative supply rail 654. The drain electrode of transistor 655 is connected to its gate electrode and to one side of a switch S652 whose other side is connected to the junction of a capacitor C652 and the gate electrode of an n-channel field effect transistor T656. The other plate of capacitor C652 and the source electrode of transistor T656 are connected to the negative supply rail 654. The drain electrode of transistor T656 is connected to the drain electrode of a p-channel field effect transistor T657 whose source electrode is connected to the positive supply rail 653. The gate electrode of transistor T657 is connected to its drain electrode and to one side of a switch S653 whose other side is connected to the junction of a capacitor C653, the gate electrode of a p-channel field effect transistor T658, and the gate electrode of a further p-channel field effect transistor T659. The other plate of the capacitor C653 is connected to the positive supply rail 653 while the source electrodes of transistors T658 and T659 are connected to the positive supply rail 653.

The drain electrode of transistor T653 is connected to the drain electrode of an n-channel field effect transistor T660 whose source electrode is connected to the negative supply rail 654. The gate electrode of transistor T660 is connected to its drain electrode and to the gate electrode of an n-channel field effect transistor T661. The drain electrode of transistor T661 is connected to an output terminal 660 and to the drain electrode of transistor T659. The drain electrode of transistor T658 is connected to the drain electrode of an n-channel field effect transistor T662 whose source electrode is connected to the negative supply rail 654. The gate electrode of transistor T662 is connected to its drain electrode and to the gate electrode of an n-channel field effect transistor T663. The drain electrode of transistor T663 is connected to an output terminal 661 and to the drain electrode of transistor T654. The source electrodes of transistors T661 and T663 are connected to the negative supply rail 654.

The operation of the memory module shown in FIG. 19 will be explained with reference to FIG. 18 which shows the relationship of clock signals $\phi A$ and $\phi B$ to sample periods $P_n$, $P_{n+1}$, etc. Sampled differential currents in $i_n^+$ and $i_n^-$ are applied to inputs 650 and 651 respectively in sample period $P_n$. The switches S650 and S652 are operated by the clock signal $\phi A$ and the switches S651 and S653 are operated by the clock signal $\phi B$. Thus the switches S650 and S652 are closed during the first part of the sampling period $P_n$. Consequently during the period $\phi A$ of the sampling period $P_n$ the current $i_n^+ +j$ is fed to the input of the current mirror circuit formed by transistors T650 and T651. The capacitor C650 becomes charged to the gate-source potential of transistor T650. Consequently, when switch S650 opens at the end of the period $\phi A$ in sampling period $P_n$ the current through transistor T651 is maintained at the value $i_n^+ +j$ by the charge on capacitor C650 which provides the appropriate gate potential for transistor T651. During the period $\phi B$ of the sampling period $P_n$ the switch S651 closes. The current fed to the input of the current mirror circuit formed by transistors T652 and T653 is equal to $j+i_n^+$ which is produced by the transistor T651. As a result the capacitor C651 charges to the gate potential of transistor T652. When the switch S651 opens at the end of the period $\phi B$ of sampling period $P_n$ the charge on capacitor C651 maintains the gate potential of transistor T653 at a value which causes the transistor T653 to produce the current $i_n^+ +j$. This current is fed to the input of a current mirror circuit formed by transistors T660 and T661 which produces at its output the current $A.(i_n^+ +j)$. At the same time the transistor T654 produces the current $A.(j+i_n^+)$.

Also during the sampling period $P_n$ the current $i_n^-$ is fed to input 651 and consequently during the period $\phi A$ of sampling period $P_n$ the current $j+i_n^-$ is fed to the input of the current mirror circuit formed by transistors T655 and T656. The capacitor C652 charges to the gate-source potential of transistor T655 and at the end of the period $\phi A$, when the switch S652 opens, the charge on capacitor C652 maintains the gate potential of transistor T656 such that the current $j+_{in}^-$ is produced at the drain of transistor T656. This current is fed to the input of the current mirror formed by transistors T657 and T658 when switch S653 is closed. The switch S653 is closed during the period $\phi B$ of the sampling period $P_n$ and consequently the voltage on capacitor C653 reaches the gate potential of transistor T657. At the end of the period $\phi B$ of the sampling period $P_n$ the transistor T658 produces the current $j+i_n^-$ due to the charge on capacitor C653 maintaining its gate potential. At the end of the period $\phi B$ of the sampling period $P_n$ the transistor T658 provides the current $j+i_n^-$ to the input of a current mirror circuit formed by transistors T662 and T663. As a result the output from transistor T663 has the value $A.(j+i_n^-)$. Further, the transistor T659 produces the current $A.(j+i_n^-)$. Consequently the output current at terminal 660, which is the output current produced by transistor T659 minus the output current produced by transistor T661, is equal to $A.(-j+i_n^-)-A.(j+i_n^+)$ which is equal to $-A.(i_n^+-i_n^-)$. Similarly, the output at output 661, which is equal to the current produced by transistor T654 minus the current produced by transistor T663, is equal to $A.(i_n^+ +i_n^-)$. However, these two output currents are produced during the sampling period $P_{n+1}$. Consequently the memory module shown in FIG. 19 produces differential output currents from differential input currents, the output currents being delayed by one sampling period with respect to the input currents.

FIG. 20 shows an integrator circuit having an input 620 which is connected to the junction of a current source 621 and the drain electrode of an n-channel field effect transistor T621. The other end of the current source 621 is connected to a positive supply rail 622 while the source electrode of transistor 621 is connected to a negative supply rail 623. The drain electrode of transistor 621 is connected to its gate electrode and to one end of a switch S621. The other end of the switch S621 is connected to the junction of a capacitor C621 and the gate electrode of an n-channel field effect transistor T622. The source electrode of transistor T622 and the other end of the capacitor C621 are connected to the negative supply rail 623. The drain electrode of transistor T622 is connected to the drain electrode of a p-channel field effect transistor T623 whose source electrode is connected to the positive supply rail 622. The drain electrode of transistor T623 is connected to its gate electrode and to one end of a switch S622. The other end of the switch S622 is connected to the junction of the gate electrode a p-channel field effect transistor T624 and a capacitor C622. The source electrode of transistor T624 and the other end of capacitor C622 are connected to the positive supply rail 622. The gate electrode of transistor T624 is further connected to the gate electrode of a p-channel field effect transistor T626 whose source electrode is connected to the positive supply rail 622. The drain electrode of transistor T624 is connected to the drain electrode of an n-channel field effect transistor T627 whose source electrode is connected to the negative supply rail 623 and via a feedback connection 629 to the drain electrode of transistor T621. A current source 628 is connected between the positive supply rail 622 and the drain electrode of an n-channel field effect transistor T630 whose source electrode is connected to the negative supply rail 623. The drain electrode of transistor T630 is connected to its gate electrode, to the gate electrode of transistor T627, and to the gate electrode of an n-channel field effect transistor T629. The source electrode of transistor T629 is connected to the negative supply rail 623 while its drain electrode is connected to the drain electrode of transistor T626 and to an output terminal 627.

The operation of the circuit shown in FIG. 20 is as follows. Input 620 is fed by a current i which is a sampled current and remains substantially constant during each sampling period and changes in successive sampling periods to follow the continuous analog signal from which it is derived. A feedback current $i_f$ which is the difference between the currents produced by transistors T624 and T627, is produced in the feedback path 629 while an output current $i_o$, which is the difference between the currents produced by transistors T626 and T629, is produced at the output 627. The current sources 621 and 628 each produce a bias current j. The ratios of the currents conducted by transistors T623, T624 and T626 are arranged to be 1:B:A, while the ratios of the currents conducted by transistors T630, T629 and T627 are arranged to be 1:A:B. Switch S621 is arranged to be closed during a portion $\phi$ each sampling period while switch S622 is arranged to be closed during a non-overlapping portion $\phi$ of each sampling period.

During the $\phi$ portion of a sampling period $(n-1)$, see FIG. 21, the current, $i(n-1)$ is applied to input 620 and this current together with the bias current j produced by current source 621 and a feedback current $i_f$ on line 629, is applied to the input of the first memory cell. As a result a current $I_2$ is produced by transistor T622 which can be derived from the equation $$I_2 = i(n-1) + i_f$$

where
$$i_f = i_o(n-1)B/A$$
i.e., $I_2 = i(n-1) + j + i_o(n-1)B/A$.

During the $\phi$ portion of sampling period n the switch S621 is open by the current $I_2$ is maintained at its previous value by the charge on capacitor C621. Consequently the current $I_2 = i(n-1) + j + i_o(n-1)B/A$ is fed to the input of the second memory cell and as switch S622 is closed a current $I_4$ is produced by transistor T624 and a current $I_6$ is produced by transistor T626. The current $I_4$ is equal to $BI_2$ while the current $I_6$ is equal to $AI_2$. Consequently the current $I_6$ during the sampling period n $$I_6(n) = A[i(n-1) + j + i_o(n-1)B/A].$$

The current $i_o(n)$ is given by $I_6(n) - Aj$.

Consequently
$$i_o(n) = Ai(n-1) + Aj - Ai_o(n-1)B/A - Aj$$

$$= Ai(n-1) + Bi_o(n-1).$$

Converting to the z-domain:

$$i_o(z) = Ai(Z)z^{-1} + Bi_o(z)z^{-1}$$

therefore $$H(z) = \frac{i_o(z)}{i(z)} = \frac{Az^{-1}}{1 - Bz^{-1}}$$

The continuous time lossy integrator is described by $$H(s) = \pm \frac{1}{a + s\tau}$$

Using the forward Euler transform $$s \to \frac{1}{T} \cdot \frac{1 - z^{-1}}{z^{-1}}$$

t,443

Thus B=1 corresponds to a=0 and gives lossless integration. The integrator shown in FIG. 20 can be modified to perform according to the backward Euler transform by connecting the input 620 to the drain electrode of transistor T622 instead of to the drain electrode of transistor T621.

Clearly a fully differential integrator could be constructed using the fully differential current memory circuits disclosed hereinbefore with appropriate input, output, and feedback connections.

Figure 22A:
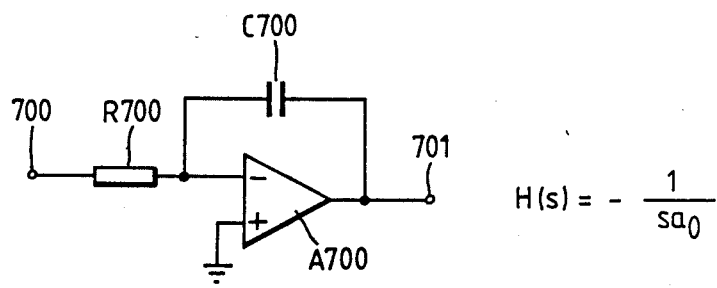
FIG. 22A shows a circuit diagram of an R.C. active ideal integrator.

FIG. 22A shows an ideal integrator formed by R-C active components. The integrator has an input 700 which is connected to one end of a resistor R700 whose other end is connected to the inverting input of an amplifier A700 and to one end of a capacitor C700. The other end of the capacitor C700 is connected to the output of the amplifier A700 and to an output terminal 701. As is well known, the transfer characteristic of the circuit shown in FIG. 20A may be expressed as $H(s) = -1/sa_o$.

Figure 22B:
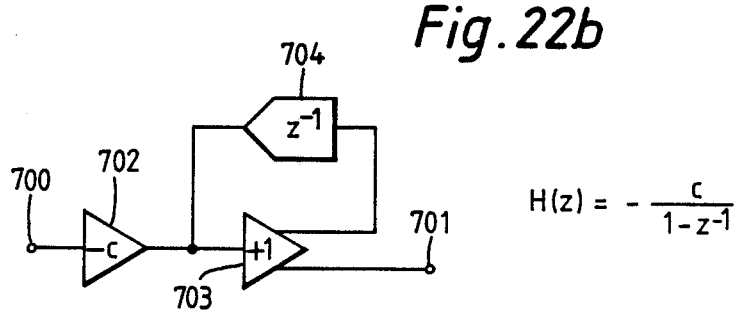
FIG. 22B shows an ideal integrator according to the invention implemented using single ended static and current memory modules.

FIG. 22B shows how such an ideal integrator can be implemented using the memory and static modules shown in the preceding drawings. The input 700 is fed to the input of a first static module 702 whose output is connected to the input of a second static module 703. The static module 703 has a first output which is fed to the input of a current memory module 704 and a second output which is fed to the output terminal 701. The output of the current memory module 704 is connected to the input of the static module 703. Using techniques well known to those skilled in the art, it can be shown that the z domain transform of the arrangement shown in FIG. 22B is $H(z) = -c/(1-z^{-1})$, which corresponds to a backward Euler transformation $(S \to (1-z^{-1})/T)$ of H(s).

In order to achieve this transfer function, the static module 702 has a gain of $-c$. The static module 703 has a gain of $+1$ from its input to both its outputs and the memory module 704 introduces a one sampling period delay to the current applied to its input and has a gain of $+1$. Thus an ideal current integrator can be implemented using static and memory modules selected from those described hereinbefore.

Figure 22C:
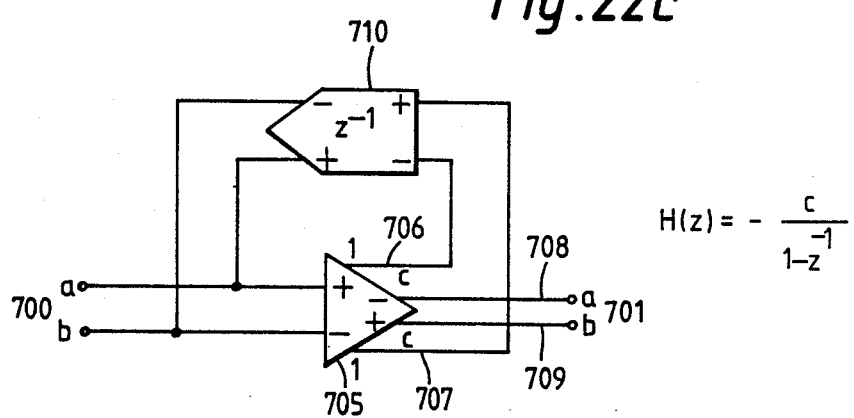
FIG. 22C shows an ideal integrator according to the invention implemented using differential static and current memory modules.

FIG. 22C shows an ideal integrator which is designed for use with differential input and output currents. Differential input currents are applied to input 700a and b which are connected to positive and negative inputs of a static module 705. Lines 706 and 707 connect negative and positive outputs of the static module 705 to negative and positive inputs, respectively of a memory module 710. The gain between the input and the outputs 706 and 707 of the static module 705 is equal to $+1$. The static module 705 has further differential outputs 708, 709 which are connected to the output terminals 701a and b. The gain between the input of the static module 705 and the outputs 708 and 709 is made equal to $+c$. The memory module 710 has positive and negative outputs which are connected to the positive and negative inputs of the static module 705. The gain of the memory module 710 is equal to $+1$.

FIGS. 22B and 22C show how, using either single ended static and memory modules or differential static and memory modules, an ideal integrator can be constructed. The memory module and static module may have more than one output and the outputs may differ in gain from each other allowing a flexible interconnection between the units and minimising the number of modules required to perform a given function.

Figure 23A:
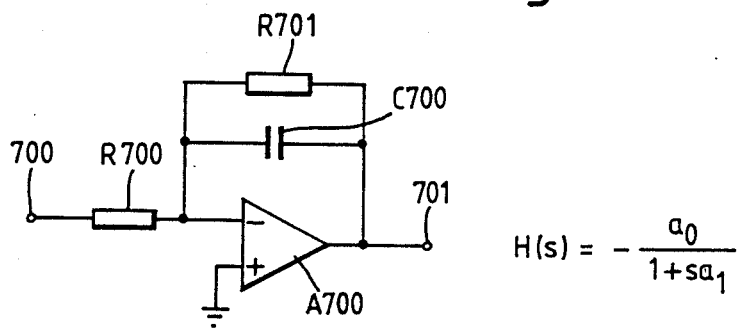
FIG. 23A shows a circuit diagram of an R.C. active lossy integrator.
Figure 23B:
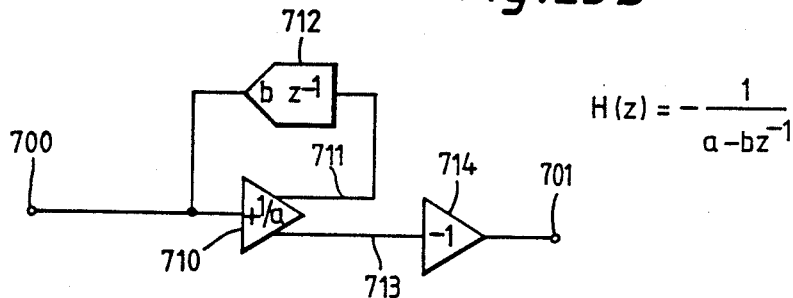
FIG. 23B shows a lossy integrator according to the invention implemented using single ended static and current memory modules.
Figure 23C:
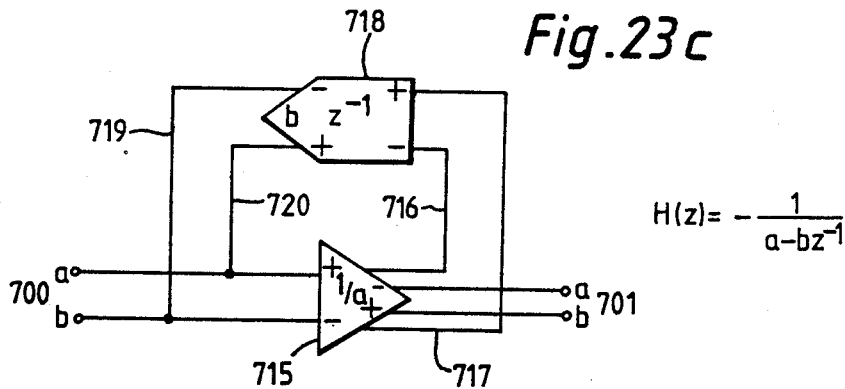
FIG. 23C shows a lossy integrator according to the invention implemented using differential static and current memory modules.

FIG. 23A shows a lossy integrator implemented by R-C active circuits and by switched current single ended (FIG. 23B) and differential circuits (FIG. 23C). The lossy integrator shown in FIG. 23A is similar to the ideal integrator shown in FIG. 22A, the only difference being the additional resistor R701 connected in parallel with capacitor C700. The resulting transfer function can be expressed as $H(s) = -a_o/(1+sa_1)$.

A switched current implementation of a lossy integrator is shown in FIG. 23B. This implementation comprises an input 700 which is connected to the input of a static module 710 having a first output 711 connected to the input of a memory module 712 and a second output 713 which is connected to the input of a further static module 714 whose output is connected to the output terminal 701. The output of the memory module 712 is connected to the input of the first static module 710. The gain of the static module 710 is equal to $+1/a$ from the input to both the outputs 711 and 713. The gain of the static module 714 is equal to $-1$ and the gain of the memory module 712 is equal to b. The transfer function of the arrangement shown in FIG. 23B can be expressed as $H(z) = -1/(a-bz^{-1})$.

FIG. 23C shows a switched current implementation of a lossy integrator for use with differential input and output currents. The differential inputs 700a and 700b are fed to positive and negative inputs, respectively, of a static module 715. A first differential output 716 and 717 is connected to a differential input of a memory module 718. A second differential output of the static module 715 is connected to the output terminals 701a and 701b. Differential output 719 and 720 of the memory module 718 is connected to the differential input of the static module 715. The static module 715 has a gain of $+1/a$ between its input and both sets of outputs while the memory module 718 has a gain of $+b$ between its input and output. Since a signal inversion can be performed by the differential static and memory modules merely by reversing the connections of the differential outputs, the inversion required for the connection to the output terminals 701a and 701b is achieved by appropriately connecting the differential outputs of the static module 715 to the output terminals. This enables a saving of one static module over the implementation using a single ended switched current module.

Figure 24:
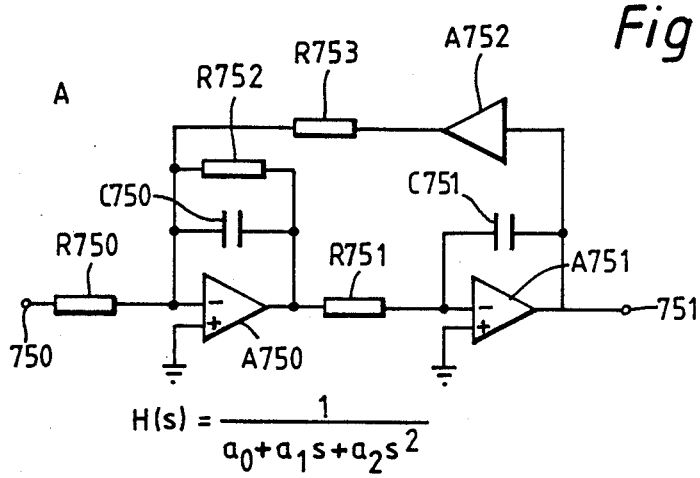
FIG. 24A shows a circuit diagram of an R.C. active implementation of a Tow-Thomas bi-quadratic section.
FIG. 24B shows a Tow-Thomas bi-quadratic section according to the invention implemented using single ended static and current memory modules.
FIG. 24C shows a Tow-Thomas bi-quadratic section according to the invention implemented using differential static and current memory modules.
Figure 24:
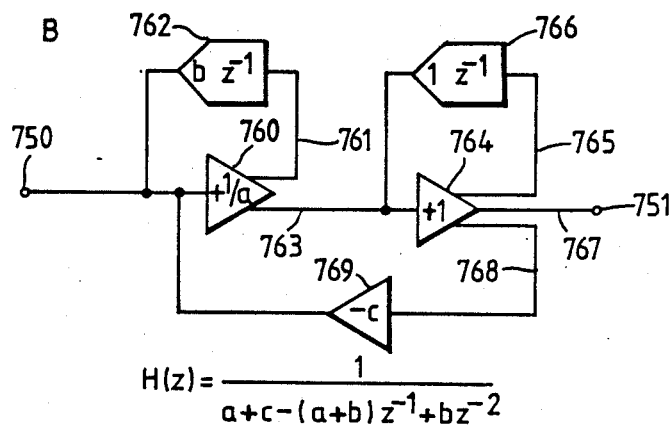
Figure 24:
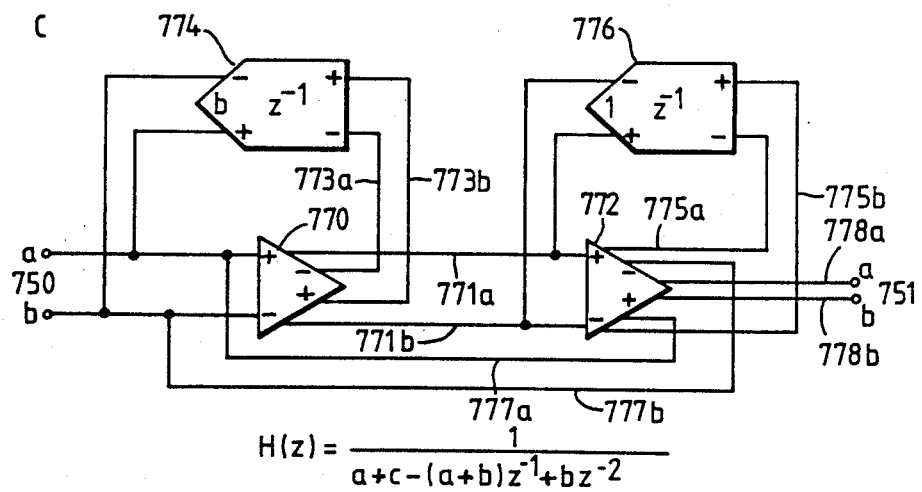

FIG. 24 shows a bi-quadratic section in the form of a Tow-Thomas bi-quadratic section. FIG. 24A shows an active R-C implementation of the Tow-Thomas bi-quadratic section which has an input 750 connected to one end of a resistor R750 whose other end is connected to an inverting input of an amplifier A750. The output of the amplifier A750 is connected to the junction of a further resistor R751, a capacitor C750 and a still further resistor R752. The other ends of the resistor R752 and capacitor C750 are connected to the junction of the inverting input of the amplifier A750 and a resistor R753. The other end of the resistor R751 is connected to an inverting input of an amplifier A751 and to one end of a capacitor C751 whose other end is connected to the output of the amplifier A751, to the input of an inverting amplifier A752 and to the output terminal 751. The output of the amplifier A752 is connected to the other end of resistor R753. Non- inverting inputs of amplifiers A750 and A751 are connected to ground. The known Tow-Thomas bi-quadratic section has the transfer function $H(s) = 1/(a_0 + a_1s + a_2s^2)$.

FIG. 24B shows a single ended switch current implementation of the Tow-Thomas bi-quadratic section shown in FIG. 24. The implementation shown in FIG. 24B has an input 750 which is connected to the input of a static module 760 which has a first output 761 connected to an input of a memory module 762. A second output 763 of the static module 760 is connected to the input of a further static module 764 which has a first output 765 connected to the input of a further memory module 766, a second output 767 which is connected to the output 751 and a third output 768 which is connected to the input of a static module 769. The output of the static module 769 is connected to the input of the static module 760, as is the output of the memory module 762. The output of the memory module 766 is connected to the input of the static module 764. The static module 760 has a gain of +1/a between its input and both outputs, the static module 764 has a gain of +1 between its input and all three outputs, and the static module 769 has a gain of −c between its input and output. The memory module 762 has a gain of +b between its input and output, while memory 766 has a gain of +1 between its input and output. The implementation shown in FIG. 24B has the transfer characteristic $H(z) = 1/(a + c - [a + b]z^{-1} + bz^{-2})$.

FIG. 24C shows a switched current implementation of a Tow-Thomas bi-quadratic section for use with differential input and output currents. The differential input currents are applied to inputs 750a and b which are connected to positive and negative inputs respectively of a static module 770. A first pair of differential outputs 771a and b are connected to differential inputs of a further static module 772 while a second pair of differential outputs 773a and b are connected to a differential input of a memory module 774. A first pair of differential outputs 775a and 775b of the static module 772 are connected to a differential input of a further memory module 776. A second set of differential outputs 777a and b of the static module 772 is connected to the differential input of the static module 770. A third set of differential outputs 778a and b is connected to the differential outputs 751a and b. The differential output of the memory module 774 is connected to the differential input of the static module 770, while the differential output of the memory module 776 is fed to the differential input of the static module 772. The static module 770 has a gain of +1/a between its input and both sets of outputs, the memory module 774 has a gain of +b between its input and output, the memory module 776 has a gain of +1 between its input and output, and the static module 772 has a gain of +1 between its input and first output, a gain of c between its input and second output, and a gain of +1 between its input and third output. In order to obtain the necessary signal inversion between the static module 772 and the static module 770, the second set of outputs of the static module 772 are connected such that the positive output is connected to the negative input of the static module 770 and the negative output is connected to the positive input of the static module 770. Thus, by constructing the static module 772 with three outputs each of which can have a desired gain, and appropriately selecting the polarity of each output, the requirement for a separate gain stage (or static module) having a gain of −c can be eliminated. As with the arrangement shown in FIG. 24B, the transfer function of the arrangement shown in FIG. 24C can be expressed by $H(z) = 1/(a + c - [a + b]z^{-1} + bz^{-2})$.

FIGS. 22, 23 and 24 illustrate how the static and memory modules can be combined to perform various system functions. These Figures show three typical arrangements which are commonly used as building blocks for electrical filters. Clearly, other filter sections may be constructed from these basic modules.

The modules shown in FIGS. 2 to 21 assume that the signal inputs and outputs are in the form of signal currents. However, in most systems the external signals to be processed are presented in the form of signal voltages. As a result, as explained with reference to FIG. 1, it is necessary to provide a voltage to current converter and a corresponding current to voltage converter. Furthermore the input and output signals will not normally be available or required in differential form and hence the voltage to current converter may be required to convert to differential form and the current to voltage converter may be required to convert from differential to single-ended form.

Figure 25:
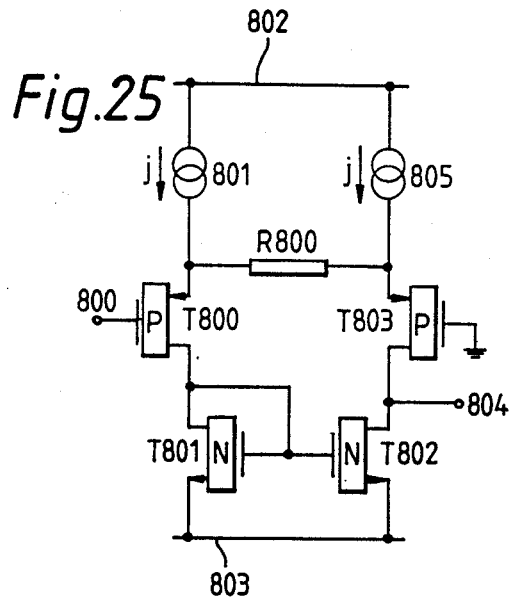
FIG. 25 shows a first embodiment of a voltage to current converter suitable for use in the arrangement shown in FIG. 1.

FIG. 25 shows a voltage to current converter for producing single-ended currents which has an input 800 connected to the gate electrode of a p-channel field effect transistor T800. The source electrode of transistor T800 is connected to the junction of a resistor R800 and a current source 801 whose other end is connected to a positive supply rail 802. The drain electrode of transistor T800 is connected to the drain electrode of an n-channel field effect transistor T801 whose source electrode is connected to a negative supply rail 803. The drain electrode of transistor T801 is connected to its gate electrode and also to the gate electrode of an n-channel field effect transistor T802. The source electrode of transistor T802 is connected to the negative supply rail 803 while its drain electrode is connected to an output 804 and to the drain electrode of a p-channel field effect transistor T803. The gate electrode of transistor T803 is connected to ground while its source electrode is connected to the junction of the other end of resistor R800 and one end of a current source 805 whose other end is connected to the positive supply rail 802.

The circuit shown in FIG. 25 converts an input voltage at input 800 into an output current at output 804. The output current i is approximately equal to $V_{in}/R800$. The circuit shown in FIG. 25 is a standard transconductance stage and for good linearity the value of R800 should be very much greater than 1/gm of the input transistors T800 and T803.

Figure 26A:
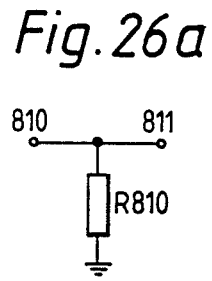
FIG. 26A shows a first embodiment of a current to voltage converter suitable for use in the arrangement shown in FIG. 1.

The output current to voltage converter could in theory be the simple arrangement shown in FIG. 26A, that is an input 810 which is connected to one end of a resistor R810 whose other end is connected to ground and an output 811 connected to the one end of resistor R810. From a simple application of Ohms Law the output voltage is equal to the input current multiplied by the resistance of resistor R810. However, the simple resistor shown in FIG. 26A is not ideal since the cascade connection of it and the input voltage to current converter shown in FIG. 25 is not linear.

Figure 26B:
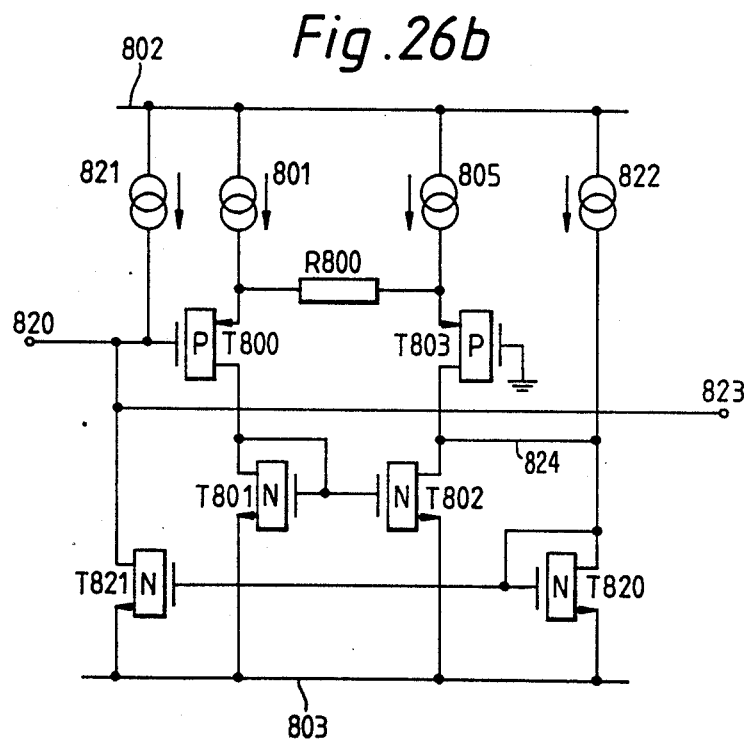
FIG. 26B shows a second embodiment of a current to voltage converter suitable for use in the arrangement of FIG. 1.

FIG. 26B shows a current to voltage converter which overcomes this disadvantage. The current to voltage converter shown in FIG. 26B includes the voltage to current converter shown in FIG. 25 as part of a feedback loop. The current to voltage converter has an input 820 which is connected to the junction of the sale of transistor T800 and one end of a current source 821 whose other end is connected to the positive supply rail 802. A further current source 822 is connected between the positive supply rail 802 and the drain of transistor T802. The drain of transistor T802 is further connected to the gate of an n-channel field effect transistor T820. The gate electrode of transistor T820 is connected to its drain electrode and to the gate electrode of a further n-channel field effect transistor T821. The source electrodes of the transistors T820 and T821 are connected to the negative supply rail 803 while the drain electrode of transistor T821 is connected to the gate electrode of transistor T800 and to an output 823.

Since the arrangement shown in FIG. 26B contains the voltage to current converter shown in FIG. 25 within the feedback loop, the current on line 824 adjusts until it is equal to the current i applied to input 820. Consequently the voltage produced at terminal 823 is the voltage at the input 820 caused by the current i fed to the gate electrode of transistor T800 i.R800. Thus if the circuit shown in FIG. 25 is connected in cascade with the circuit shown in FIG. 26B the input voltage and output voltage will be linearly related even though the transfer characteristic of each of the separate modules is non-linear.

Figure 27:
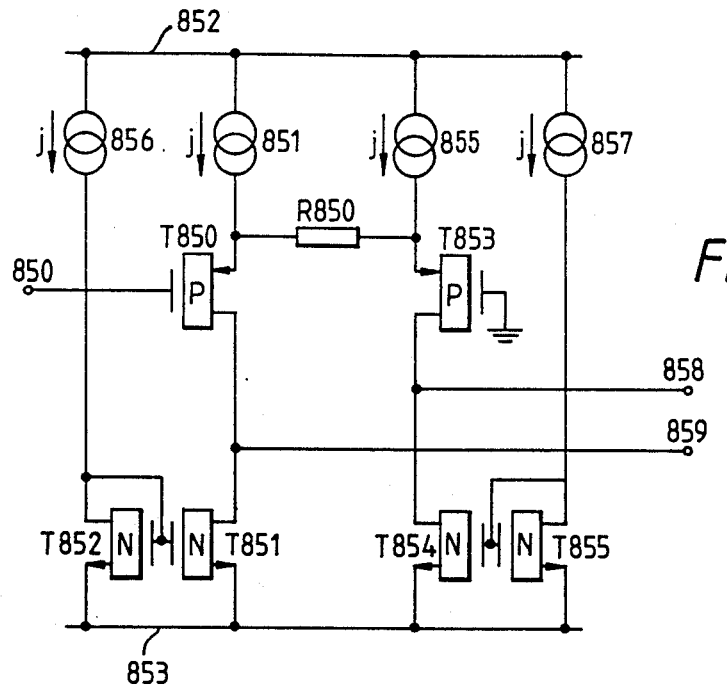
FIG. 27 shows a second embodiment of a voltage to current converter suitable for use in the arrangement shown in FIG. 1.

FIG. 27 shows a voltage to current converter which produces a differential current output from a single ended voltage input. The arrangement shown in FIG. 27 has an input 850 which is connected to the gate electrode of a p-channel field effect transistor T850. The source electrode of the transistor T850 is connected via a current source 851 to a positive supply rail 852. The drain electrode of transistor T850 is connected to the drain electrode of an n-channel field effect transistor T851 whose source electrode is connected to a negative supply rail 853. A current source 855 is connected between the positive supply rail 852 and the source electrode of a p-channel field effect transistor T853. A resistor R850 is connected between the source electrodes of transistors T850 and T853. The gate electrode of transistor T851 is connected to the gate electrode of an n-channel field effect transistor T852 whose source electrode is connected to the negative supply rail 853. The gate and drain electrodes of transistor T852 are connected to the positive supply rail 852 via a current source 856. The drain electrode of transistor T853 is connected to the drain electrode of an n-channel field effect transistor T854 whose source electrode is connected to the negative supply rail 853. The gate electrode of transistor T854 is connected to the gate electrode of an n-channel field effect transistor T855 whose source electrode is connected to the negative supply rail 853. The gate and drain electrodes of transistor T855 are connected via a current source 857 to the positive supply rail 852. A first output 858 is connected to the junction of the drain electrodes of transistors T853 and T854 while a second output 859 is connected to the junction of the drain electrodes of transistors T850 and T851. With the arrangement shown in FIG. 27 the differential output current at outputs 858 and 859 ($i^+ - i^-$) is approximately equal to $V_{in}/R850$.

Figure 28:
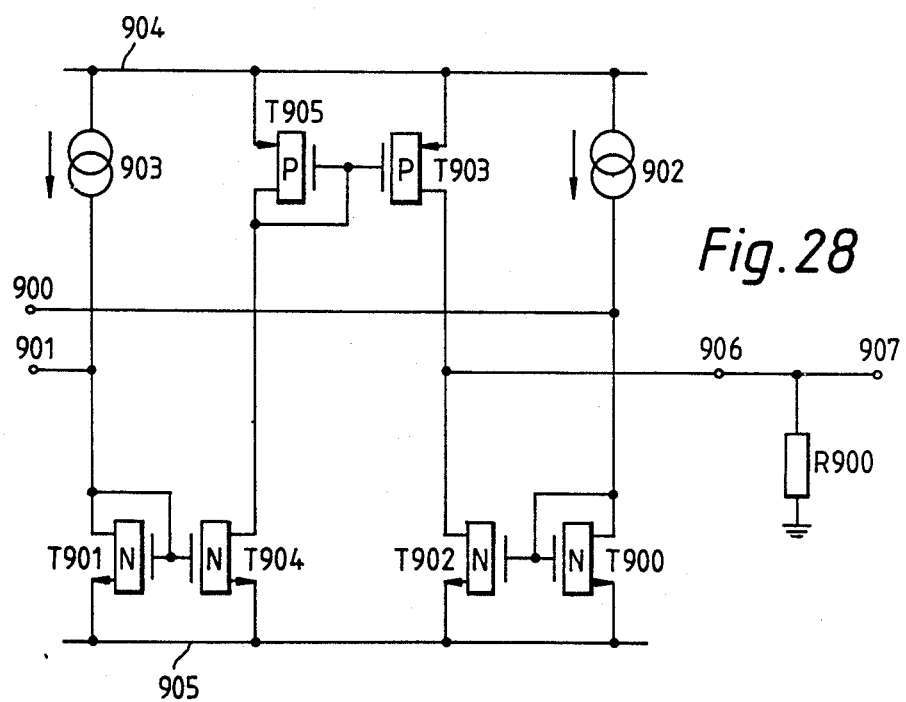
FIG. 28 shows a third embodiment of a current to voltage converter suitable for use in the arrangement shown in FIG. 1.

FIG. 28 shows a first embodiment of a differential current to single-ended voltage converter. The arrangement shown in FIG. 28 has inputs 900 and 901 for a differential current input. The input 900 is connected to the junction of a current source 902 and the drain electrode of an n-channel field effect transistor T900 while the input 901 is connected to the junction of a current source 903 and the drain electrode of an n-channel field effect transistor T901. The other ends of the current sources 902 and 903 are connected to a positive supply rail 904 while the source electrodes of transistors T900 and T901 are connected to a negative supply rail 905. The drain electrode of transistor T900 is connected to its gate electrode and to the gate electrode of an n-channel field effect transistor T902. The source electrode of transistor T902 is connected to the negative supply rail 905 while its drain electrode is connected to the drain electrode of a p-channel field effect transistor T903 whose source electrode is connected to the positive supply rail 904. The drain electrode of transistor T901 is connected to its gate electrode and to the gate electrode of an n-channel field effect transistor T904. The source electrode of transistor T904 is connected to the negative supply rail 905 while its drain electrode is connected to the drain electrode of a p-channel field effect transistor T905 whose source electrode is connected to the positive supply rail 904. The drain electrode of transistor T905 is connected to its gate electrode and to the gate electrode of transistor T903. The junction of the drain electrodes of transistors T902 and T903 is connected via a line 906 to one end of a resistor R900 and to an output 907. The other end of resistor R900 is connected to ground.

The arrangement shown in FIG. 28 effectively comprises a differential to single-ended current converter which then feeds a simple resistive current to voltage converter formed by resistor R900. Thus the current $i^+$ applied to input 901 is fed to the input of a current mirror circuit formed by transistors T901 and T904, the current applied to the drain of transistor T901 being equal to $j+i^+$. Consequently the current produced at the drain electrode of transistor T904 is also equal to $j+i^+$. This current is reproduced at the drain electrode of transistor T903 as transistors T905 and T903 are connected to form a current mirror circuit. The current $i^-$ is applied to input 900 and consequently the drain current of transistor T900 is equal to $j+i^-$. As a result the current at the drain of transistor T902 is equal to $j+i^-$. Thus the output current on line 906 is equal to $i^+-i^-$. As a result an output voltage equal to $(i^+-i^-)$ R900 is produced at output 907. Again, as with the single-ended voltage to current and current to voltage converters, the cascade arrangement of the circuits shown in FIGS. 27 and 28 is not linear. In order to produce a linear arrangement the current to voltage converter shown in FIG. 29 may be used.

Figure 29:
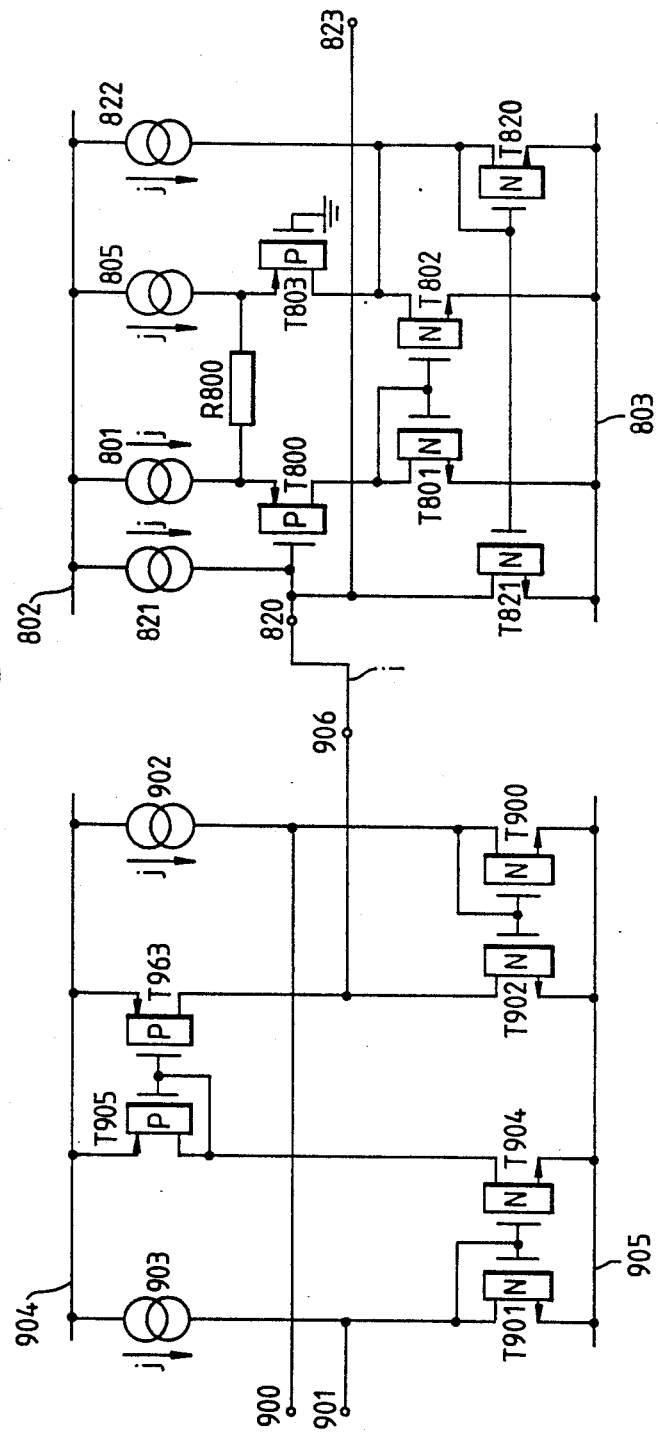
FIG. 29 shows a fourth embodiment of a current to voltage converter suitable for use in the arrangement shown in FIG. 1.

As can be seen, the arrangement shown in FIG. 29 comprises the differential to single-ended current converter of FIG. 28 and the current to voltage converter shown in FIG. 26B. The output line 906 of the differential to single-ended current converter is connected to input 820 of the current to voltage converter shown in FIG. 26B. Thus the output voltage at output 823 $(i^+-i^-)$ R800 and the cascade arrangement of the circuits shown in FIG. 29 is now linear.

The current mirrors shown in the static and memory modules and in the current to voltage and voltage to current converters have been illustrated as the simplest basic current mirror circuit in order to reduce the complexity of description. However, for best performance the current mirrors should have a high output impedance. A cascode connection of transistors in the current mirror may be used to increase the output impedance of the current mirrors. Two such current have been disclosed in U.S. Pats Nos. 4,550,284 and 4,583,037. A further cascoded current mirror is disclosed in our co-pending U.K. Application No. 8721758, which corresponds to In addition, to enable better matching between the input and output branches, source degeneration resistors may be included in the current mirrors and, if desired, dynamic element matching may also be used to obtain a more accurate matching between the input current applied to and the output current derived from the current mirror circuits. Further, it should be noted that the capacitor connected to the gate of the field effect transistor in each memory cell making up the current memory modules shown in any of FIGS. 7, 8, 9, 10, 12, 17 and 19 may have its other plate connected either to the positive or to the negative rail since its only function is to store a charge such that the gate electrode of the transistor is held at the potential reached when the associated switch was closed. The same consideration also applies to the integrator shown in FIG. 20.

From reading the present disclosure, other modifications will be apparent to persons skilled in the art. Such modifications may involve other features which are already known in the design and use of analog electrical circuits and devices and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features, whether or not it relates to the same invention as presently claimed in any claim and whether or not it mitigates any or all of the same technical problems as does the invention presently claimed.

What is claimed:

1. A circuit arrangement for processing samples analog electrical current signals comprising: means for combining, in predetermined proportions, an input sample current in a present sample period with current derived from input sample current in one or more preceding sample periods, and means for deriving a processed output signal from the combined current produced by the combining means in successive sample periods; wherein the circuit arrangement further comprises a plurality of circuit modules, each circuit module having a current input for receiving a bidirectional input signal current and a current output for supplying a bidirectional output signal current, means for adding a bias current to the bidirectional input signal current to produce a unidirectional current for processing by the circuit module, and means for subtracting a suitably scaled bias current from a processed unidirectional current to produce a bidirectional signal current at the current output of the circuit module.

2. A circuit arrangement as claimed in claim 1 wherein one of the circuit modules comprises a current memory module which is capable of reproducing at its output in one sampling period a scaled version of a current applied to its input in a previous sampling period.

3. A circuit arrangement as claimed in claim 2 wherein the current memory module comprises a current input, a current output, first and second switches controlled by first and second non-overlapping clock signals, and first and second memory cells, wherein the current input is coupled to the first memory cell by means of the first switch and the first memory cell is coupled to the second memory cell by means of the second switch, an output of the second memory cell being coupled to the current output of the current memory module.

4. A circuit arrangement as claimed in claim 3, wherein each memory cell comprises a field effect transistor having a capacitor connected between its gate and source electrodes.

5. A circuit arrangement as claimed in claim 4 wherein which in each memory cell the field effect transistor forms an output branch of a current mirror circuit.

6. A circuit arrangement, as claimed in claim 5, in wherein the first and second switches are connected so as to isolate the input and output branches of each current mirror circuit, the output branch of a first current mirror circuit being connected to an input branch of a second current mirror.

7. A circuit arrangement as claimed in claim 5 or claim 6, wherein at least one current mirror circuit has a non-unity current ratio between its input and output branches.

8. A circuit arrangement as claimed in claim 6 wherein the second current mirror circuit has a plurality of output branches.

9. A circuit arrangement as claimed in claim 2 wherein the current memory module includes a first memory cell having an input, an output, means comprising a first switch which is conductive during a first portion of a sample period for connecting the input of the first memory cell to a main current conducting path of a transistor, means comprising a second switch which is conductive during the first portion for connecting a junction of the first switch and the main current conducting path of the transistor to a current maintaining means, and means for connecting the main current conducting path of the transistor to the output of the first memory cell during a second portion of the sampling period, a second memory cell having an input coupled to the output of the first memory cell and an output coupled to the output of the current memory module, and means for coupling the input of the current memory module to the input of the first memory cell.

10. A circuit arrangement as claimed in claim 9 wherein the means for connecting the main current conducting path of the transistor to the output of the first memory cell comprises a third switch which is conductive during a second portion of the sampling period which does not overlap the first portion, an output current from the first memory cell being available when the third switch is conductive.

11. A circuit arrangement as claimed in claim 10 wherein the second memory cell comprises an input, an output, means comprising a first switch which is conductive during a second portion of a sample period for connecting the input of the second memory cell to the main current conducting path of a second transistor, means comprising a second switch which is conductive during the second portion for connecting a junction of the first switch and the main current conducting path of the second transistor to a current maintaining means, and means comprising a third switch which is conductive during a first portion of the sampling period which does not overlap the second portion for connecting the main current conducting path of the second transistor to the output of the second memory cell, an output current from the current memory module being available when the third switch of the second memory cell is conductive.

12. A circuit arrangement as claimed in any of claim 9 to 11 wherein at least one comprises a field effect transistor and the current maintaining means comprises a capacitor connected between the gate and source electrodes of the transistor.

13. A circuit arrangement as claimed in claim 12 wherein the capacitor comprises the gate-source capacitance of the transistor.

14. A circuit arrangement as claimed in any of claims 9 to 11 further comprising means for feeding a bias current to the input of the first memory cell, means for drawing a corresponding bias current from the output of the second memory cell, and a third memory cell, said third memory cell being connected in the current memory module so as to store the bias current fed into the input of the first memory cell for subtraction from the output current provided by the second memory cell.

15. A circuit arrangement as claimed in any of the claims 9 to 11 wherein the second memory cell has one or more further outputs.

16. A circuit arrangement as claim in any of claims 3 to 6 or 9–11 wherein the means for subtracting a suitably scaled bias current comprises a bias current source connected to the input of a current mirror circuit having a number of outputs corresponding to the number of outputs of the current memory module, output current(s) produced by the current mirror circuit being subtracted from the corresponding output current(s) of the second memory cell.

17. A circuit arrangement as claimed in any of claims 2 to 6 or 9–11 wherein, current memory module has differential inputs and outputs and comprises a plurality of current memory cells, means for coupling each of the differential inputs to a respective current memory cell and means for combining the outputs of selected memory cells for application to the differential current outputs.

18. A circuit arrangement as claimed in any of claims 1-4 or 9–11 including an integrator circuit module which is capable of integrating a bi-directional current applied to its input.

19. A circuit arrangement as claimed in claim 18 wherein the integrator circuit module comprises a current memory module and a feedback loop from a stored current output to a summing arrangement so that a stored current can be added to each current input sample.

20. An integrator circuit as claimed in claim 19 connected so as to integrate differential input currents.

21. A circuit arrangement as claimed in claims 1-4 further comprising a static module capable of producing at its output a scaled version of a current applied to its input.

22. A circuit arrangement as claimed in claim 21, wherein the static module has a plurality of outputs each of which is capable of producing an individually scaled output.

23. A circuit arrangement as claimed in claim 21 wherein the static module has a plurality of inputs for applying a plurality of input currents to the static module to enable current addition or subtraction to be performed by the static module.

24. A circuit arrangement as claimed in claim 23 wherein the static module performs a current inversion between its inputs and outputs.

25. A circuit arrangement as claimed in claim 21 wherein the static module comprises a current scaling circuit, the current scaling circuit comprises means for applying an input current to an input branch of a first current mirror circuit, means for applying a bias current to the input branch of the first current mirror circuit, means for feeding a current from an output branch of the first current mirror circuit to an input branch of a second current mirror circuit, means for feeding a current from an output branch of the second current mirror circuit to the output of the static module, and means for subtracting a suitably scaled bias current from the current in the output branch of the second current mirror circuit so that an output current produced by the scaling circuit is a scaled version of the input current applied to an input of the scaling circuit.

26. A circuit arrangement as claimed in claim 25, wherein the means for applying a bias current to the input branch of the first current mirror circuit comprises a first current source and means for adding the current produced by a first current source to the input current the means for subtracting a bias current comprises a second current source and a current summing junction to which an output current from the second current source and the output current from the output branch of the second current mirror are applied with appropriate polarity, and means for deriving the scaled output current from the summing junction.

27. A circuit arrangement as claimed in claim 25 wherein the second current mirror circuit has a plurality of outputs, the static module has a corresponding plurality of outputs, and each output of the second current mirror circuit is coupled to a corresponding output of the static module.

28. A circuit arrangement as claimed in claim 27 wherein the means for subtracting the suitably scaled bias current comprises a bias current source connected to an input of a further current mirror circuit having a number of outputs corresponding to the number of outputs of the second current mirror circuit, output currents produced by the further current mirror circuit being subtracted from corresponding output currents of the second current mirror circuit.

29. A circuit arrangement as claimed is claim 28 wherein the static module is connected to produce at its output an inversion of the current applied to its input, wherein the input of the static module is coupled to the input of the further current mirror circuit instead of the input of the first current mirror circuit.

30. A circuit arrangement as claimed in claim 28 wherein the static module is connected to subtract a first current from a second current and has a first input for application of the second current which is coupled to the input of the first current mirror circuit, a second input for application of the first current which is coupled to the input of the further current mirror circuit, and one or more outputs which are coupled to respective output branches of the second current mirror circuit.

31. A circuit arrangement as claim in claim 21 wherein the static module is connected to process a differential input current and produce a differential output current.

32. A circuit arrangement as claim in claim 31 wherein the static module comprises, first and second inputs for receiving a differential input current, first and second outputs for producing a differential output current, means for coupling the first input of the static module to a first input of a first current summing means, means for coupling a first bias current source to a second input of the first current summing means, means for coupling an output of the first current summing means to an input branch of a first current mirror circuit, means for coupling the second input to a first input of a second current summing means, means for coupling a second bias current source to a second input of the second current summing means, means for coupling an output of the second current summing means to an input branch of a second current mirror circuit, means for coupling a first output branch of the first current mirror circuit to an input branch of a third current mirror circuit, means for coupling a first output branch of the second current mirror circuit to an input branch of a fourth current mirror circuit, means for coupling a second output branch of the first current mirror circuit to a first input of a third current summing means, means for coupling an output branch of the fourth current mirror circuit to a second input of the third current summing means, means for coupling an output of the third current summing means to the first output, means for coupling a second branch of the second current mirror circuit to a first input of a fourth current summing means, means for coupling an output branch of the third current mirror circuit to a second input of the fourth current summing means, and means for coupling an output of the fourth current summing means to the second output.

33. A circuit arrangement as claimed in claim 32 in which the static module has a number of further differential outputs wherein each of the current mirror circuits has a corresponding number of further output branches each of which is connected to appropriate further summing means.

34. A circuit arrangement as claimed in claim 32 wherein the static module has a number of further differential inputs, each further differential input being connected to a further input of the first and second current summing means.

35. A circuit arrangement as claimed in claim 7 wherein the second current mirror circuit has a plurality of output branches.

36. A circuit arrangement as claimed in claim 14 wherein, the means for subtracting a suitably scaled bias current comprises a bias current source connected to the input of a current mirror circuit having a number of outputs corresponding to the number of outputs of the current memory module, output current(s) produced by the current mirror circuit being subtracted from corresponding output current(s) of the second memory cell.

37. A circuit arrangement as claimed in claim 7 wherein, the current memory module has differential inputs and outputs and comprises a plurality of current memory cells, means for coupling each of the differential inputs to a respective current memory cell, and means for combining the outputs of selected memory cells for application to the differential current outputs.

38. A circuit arrangement as claimed in claim 14 wherein the current memory module has differential inputs and outputs and comprises a plurality of current memory cells, emans for coupling each of the differential inputs to a respective current memory cell, and means for combining the outputs of selected memory cells for application to the differential current outputs.

39. A circuit arrangement as claimed in claim 7 including an integrator circuit module which is capable of integrating a bidirectional current applied to its input.

40. A circuit arrangement as claimed in claim 39 wherein the integrator circuit module comprises a current memory module and a feedback loop from a stored current output to a summing arrangement so that a stored current can be added to each current input sample.

41. An integrator circuit as claimed in claim 18 connected so as to integrate differential input currents.

42. A circuit arrangement as claimed in claim 22 wherein the static module has a plurality of inputs for applying a plurality of input currents to the static module to enable current addition or subtraction to be performed by the static module.

43. A circuit arrangement as claimed in claim 21 wherein the static module performs a current inversion between its inputs and outputs.

44. A circuit arrangement as claimed in claim 23 wherein the static module comprises a current scaling circuit, the current scaling circuit comprising means for applying an input current to an input branch of a first current mirror circuit, means for applying a bias current to the input branch of the first current mirror circuit, means for feeding a current from an output branch of the first current mirror circuit to an input branch of a second current mirror circuit, means for feeding a current from an output branch of the second current mirror circuit to the output of the static module, and means for subtraction a suitably scaled bias current from the current in the output branch of the second current mirror circuit so that an output current produced by the scaling circuit is a scaled version of the input current applied to an input of the scaling circuit.

45. A circuit arrangement as claimed in claim 26 wherein the second current mirror circuit has a plurality of outputs, the static module has a corresponding plurality of outputs, and each output of the second current mirror circuit is coupled to a corresponding output of the static module.

46. A circuit arrangement as claimed in claim 25 wherein the static module is connected to process a differential input current and produce a differential output current.

47. A circuit arrangement as claimed in claim 46 wherein the static module comprises, first and second inputs for receiving a differential input current, first and second outputs for producing a differential output current, means for coupling the first input of the static module to a first input of a first current summing means, means for coupling a first bias current source to a second input of the first current summing means, means for coupling an output of the first current summary means to an input branch of a first current mirror circuit, means for coupling the second input to a first input of a second current summing means, means for coupling a second bias current source to a second input of the second current summing means, means for coupling an output of the second current summing means to an input branch of a second current mirror circuit, means for coupling a first output branch of the first current mirror circuit to an input branch of a third current mirror circuit, means for coupling a first output branch of the second current mirror circuit to an input branch of a fourth current mirror circuit, means for coupling a second output branch of the first current mirror circuit to a first input of a third current summing means, means for coupling an output branch of the fourth current mirror circuit to a second input of the third current summing means, means for coupling an output of the third current summing means to the first output, means for coupling a second branch of the second current mirror circuit to a first input of a fourth current summing means, means for coupling an output branch of the third current mirror circuit to a second input of the fourth current summing means, and means for coupling an output of the fourth current summing means to the second output.

* * * * *

UNITED STATES PATENT AND TRADEMARK OFFICE
CERTIFICATE OF CORRECTION

PATENT NO. : 4,958,123

DATED : September 18, 1990

INVENTOR(S) : JOHN B. HUGHES

It is certified that error appears in the above-identified patent and that said Letters Patent is hereby corrected as shown below:

IN THE ABSTRACT
   line 15, change "unidirection" to --bidirectional--.

Column 1, line 8, after "(9/5/89)" insert -- 4,866,368 (9/12/89)--;
   line 44, after "sequently" insert a comma --,--;
   line 45, after "and" insert a comma --,--;
   line 46, after "lar" insert a comma --,--.

Claim 1, line 1, change "samples" to --sampled--.

Claim 5, line 2, delete "which".

Claim 6, line 1, delete "in" (last occurrence);
   line 6, after "mirror" insert --circuit--.

Claim 12, line 1, change "claim" to --claims--;
   line 2, after "one" insert --transistor--.

Claim 16, line 8, delete "the".

Claim 17, line 2, after "," insert --the--.

Claim 26, line 4, change "the" to --a--;
   line 5, change "a" to --the--;
   line 6, after "current" (first occurrence) insert a comma --,--;

Claim 38, line 4, change "emans" to --means--.

Claim 44, line 12, change "subtraction" to --subtracting--.

UNITED STATES PATENT AND TRADEMARK OFFICE
CERTIFICATE OF CORRECTION

PATENT NO. : 4,958,123

DATED : September 18, 1990

INVENTOR(S) : John B. Hughes

It is certified that error appears in the above-identified patent and that said Letters Patent is hereby corrected as shown below:

Claim 47, line 9, change "summary" to --summing--.

Signed and Sealed this

Twenty-fourth Day of September, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,958,123

DATED : September 18, 1990

INVENTOR(S) : JOHN B. HUGHES

It is certified that error appears in the above-identified patent and that said Letters Patent is hereby corrected as shown below:

Column 12, line 9, change "$\phi$" to --$\overline{\phi}$--;

line 11, change "$\phi$" (second occurrence) to --$\overline{\phi}$--;

line 12, change "$\phi$" (second occurrence) to --$\overline{\phi}$--;

line 14, change "$\phi$" to --$\overline{\phi}$ is--;

line 23, change "$\phi$" to --$\overline{\phi}$--;

line 28, delete "the" (second occurrence);

change "$\phi$" to --$\overline{\phi}$--;

line 65, change "$\phi$" to --$\overline{\phi}$--;

Column 13, line 6, change "$\phi$" to --$\overline{\phi}$--;

Column 14, line 30, change "$\phi$" to --$\overline{\phi}$--;

Column 16, line 10, change "$\phi$" to --$\overline{\phi}$--;

line 23, change "$\phi$" to --$\overline{\phi}$--;

Column 19, line 51, change "Transistor" to --Transistors--;

Column 20, line 23, change "$1^{+}-1$" to --$i^{+}-i^{-}$--;

UNITED STATES PATENT AND TRADEMARK OFFICE
CERTIFICATE OF CORRECTION

PATENT NO.   : 4,958,123
DATED        : September 18, 1990
INVENTOR(S)  : JOHN B. HUGHES It is certified that error appears in the above-identified patent and that said Letters Patent is hereby corrected as shown below:

Column 26, line 17, change "$\emptyset$" to --$\overline{\emptyset}$--;

line 22, change "$\emptyset$" to --$\overline{\emptyset}$--;

line 30, change "$+i_f$" to --$+J+i_f$--;

Column 31, line 8, change "sale" to --gate--;

line 28, after "T800" insert --⌒--;

Column 32, line 66, after "823" insert --⌒--;

Column 33, line 13, after "corresponds to" insert --U.S. Patent 4,864,217 (9/5/89)--.

Signed and Sealed this

Seventeenth Day of November, 1992

*Attest:*

DOUGLAS B. COMER

*Attesting Officer*    *Acting Commissioner of Patents and Trademarks*